(12) United States Patent
Chang et al.

(10) Patent No.: US 10,797,174 B2
(45) Date of Patent: Oct. 6, 2020

(54) SEMICONDUCTOR DEVICE WITH FIN END SPACER DUMMY GATE AND METHOD OF MANUFACTURING THE SAME

(71) Applicant: TAIWAN SEMICONDUCTOR MANUFACTURING CO., LTD., Hsinchu (TW)

(72) Inventors: Kai-Tai Chang, Kaohsiung (TW); Tung Ying Lee, Hsinchu (TW); Wei-Sheng Yun, Taipei (TW); Tzu-Chung Wang, Hsinchu (TW); Chia-Cheng Ho, Hsinchu (TW); Ming-Shiang Lin, Hsinchu (TW); Tzu-Chiang Chen, Hsinchu (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 16/104,692

(22) Filed: Aug. 17, 2018

(65) Prior Publication Data
US 2020/0058784 A1    Feb. 20, 2020

(51) Int. Cl.
| | |
|---|---|
| *H01L 29/78* | (2006.01) |
| *H01L 29/66* | (2006.01) |
| *H01L 21/762* | (2006.01) |
| *H01L 21/768* | (2006.01) |
| *H01L 21/8238* | (2006.01) |
| *H01L 21/033* | (2006.01) |
| *H01L 21/02* | (2006.01) |
| *H01L 23/532* | (2006.01) |

(52) U.S. Cl.
CPC ........ *H01L 29/785* (2013.01); *H01L 21/0228* (2013.01); *H01L 21/0337* (2013.01); *H01L 21/762* (2013.01); *H01L 21/76829* (2013.01); *H01L 21/823814* (2013.01); *H01L 21/823821* (2013.01); *H01L 21/823864* (2013.01); *H01L 23/5329* (2013.01); *H01L 29/6681* (2013.01); *H01L 29/66545* (2013.01); *H01L 29/66553* (2013.01); *H01L 2029/7858* (2013.01)

(58) Field of Classification Search
CPC ............. H01L 27/1211; H01L 27/0886; H01L 27/0924; H01L 29/785; H01L 29/66795; H01L 29/6681
See application file for complete search history.

(56) References Cited

U.S. PATENT DOCUMENTS

| | | | |
|---|---|---|---|
| 8,796,666 | B1 | 8/2014 | Huang et al. |
| 8,987,142 | B2 | 3/2015 | Lee et al. |
| 9,053,279 | B2 | 6/2015 | Chang et al. |
| 9,093,530 | B2 | 7/2015 | Huang et al. |
| 9,099,530 | B2 | 8/2015 | Lin et al. |
| 9,153,478 | B2 | 10/2015 | Liu et al. |
| 9,501,601 | B2 | 11/2016 | Chang et al. |

(Continued)

*Primary Examiner* — Michele Fan
(74) *Attorney, Agent, or Firm* — McDermott Will & Emery LLP

(57) ABSTRACT

A semiconductor device includes a plurality of fins on a substrate. A fin liner is formed on an end surface of each of the plurality of fins. An insulating layer is formed on the plurality of fins. A plurality of polycrystalline silicon layers are formed on the insulating layer. A source/drain epitaxial layer is formed in a source/drain space in each of the plurality of fins. One of the polycrystalline silicon layers is formed on a region spaced-apart from the fins.

15 Claims, 15 Drawing Sheets

(56) References Cited

U.S. PATENT DOCUMENTS

| | | | |
|---|---|---|---|
| 9,548,303 B2 | 1/2017 | Lee et al. | |
| 9,564,369 B1 * | 2/2017 | Kim | H01L 21/823431 |
| 9,653,583 B1 * | 5/2017 | Zhao | H01L 29/66795 |
| 9,876,114 B2 | 1/2018 | JangJian et al. | |
| 9,882,023 B2 | 1/2018 | Lin et al. | |
| 2014/0367795 A1 * | 12/2014 | Cai | H01L 27/0886 |
| | | | 257/392 |

* cited by examiner

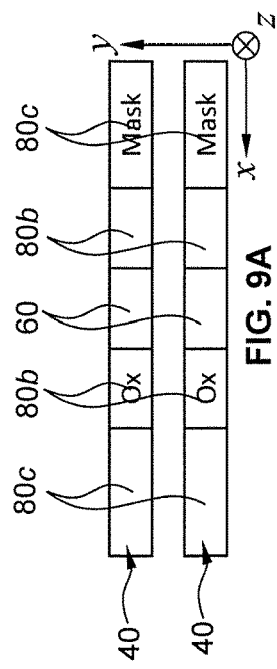

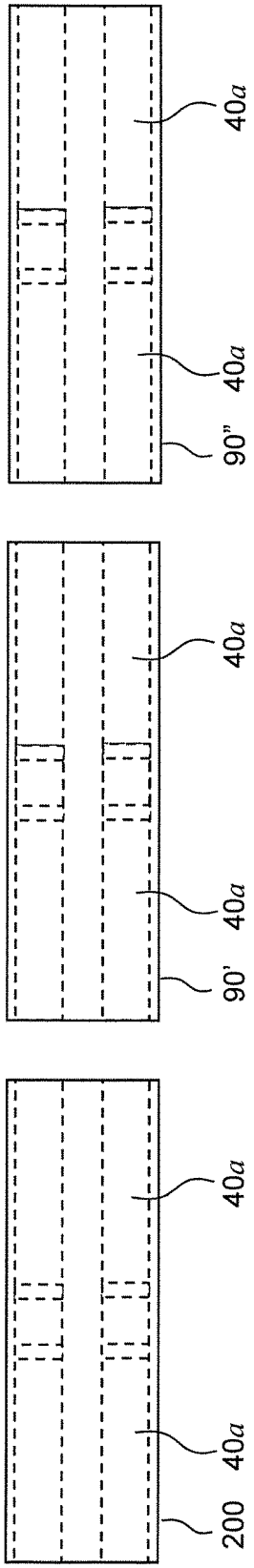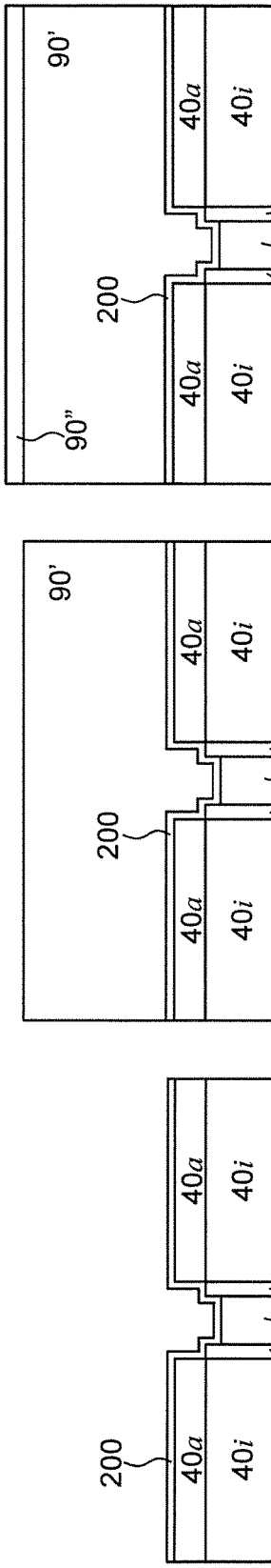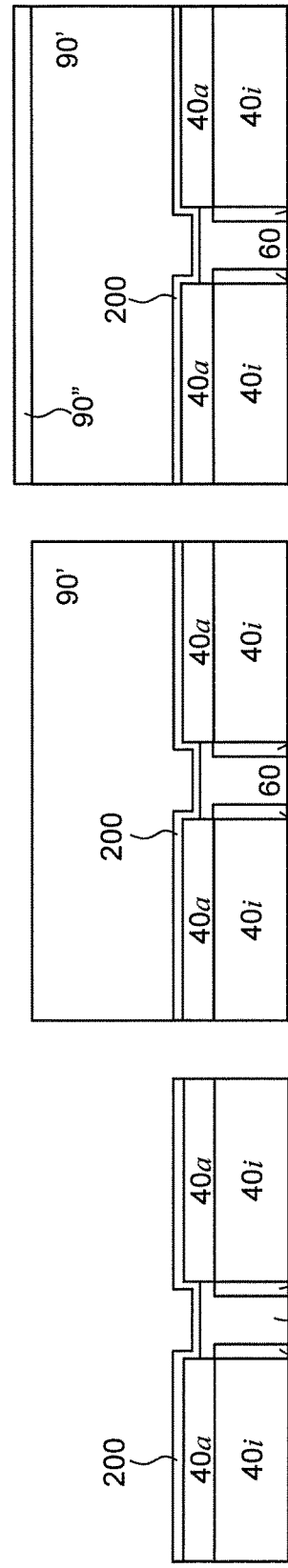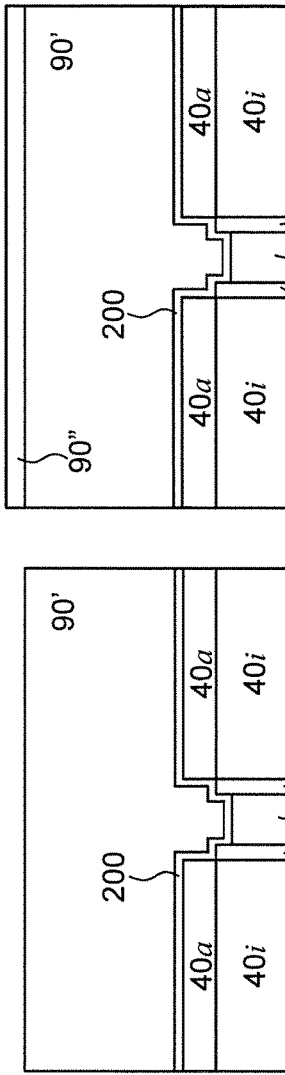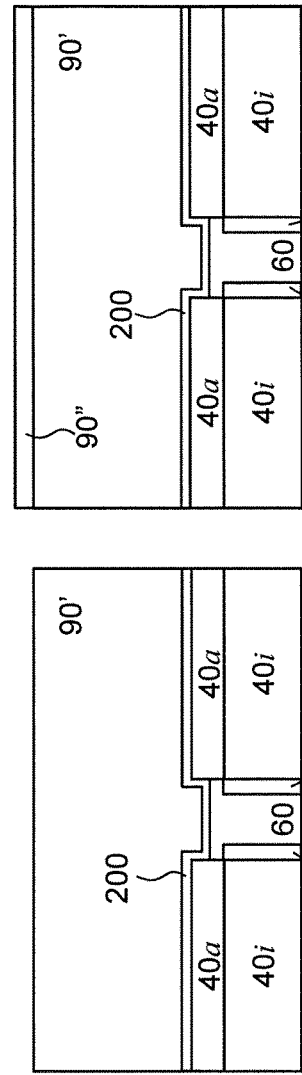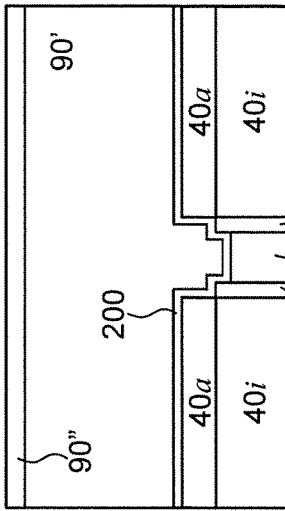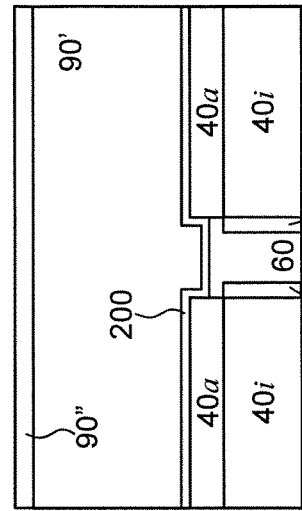

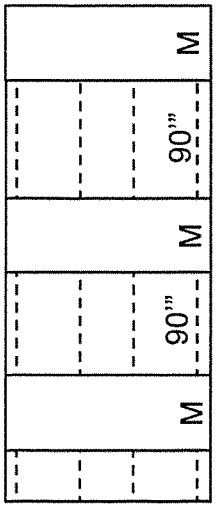
FIG. 17A
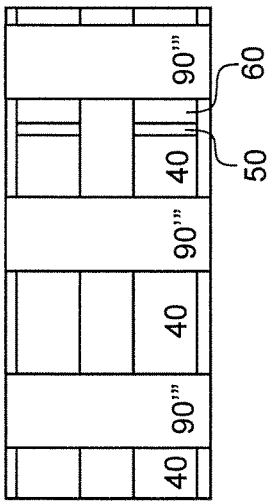
FIG. 18A
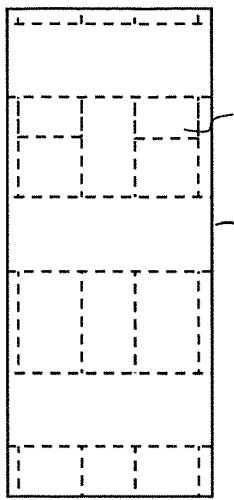
FIG. 19A
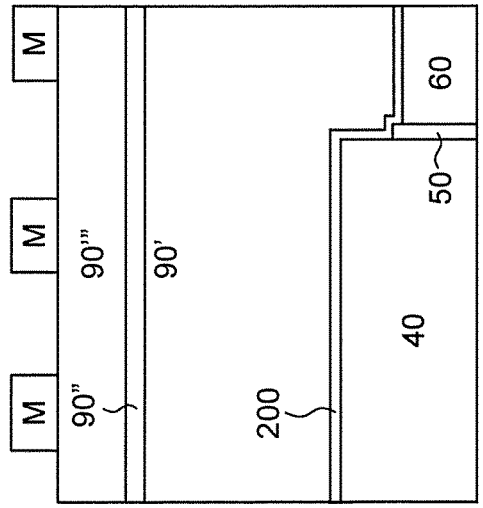
FIG. 17B
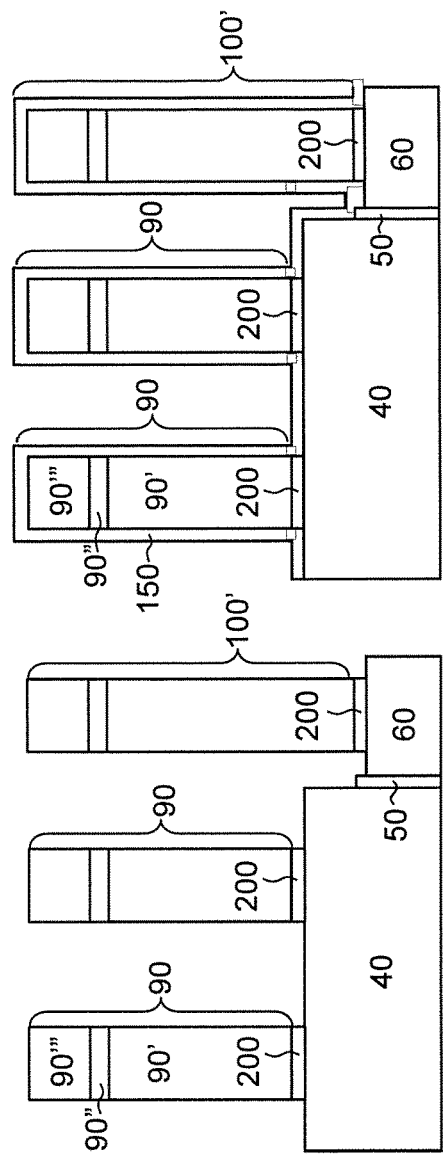
FIG. 18B
FIG. 19B

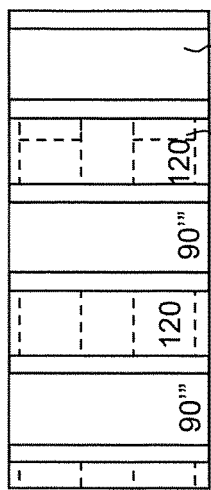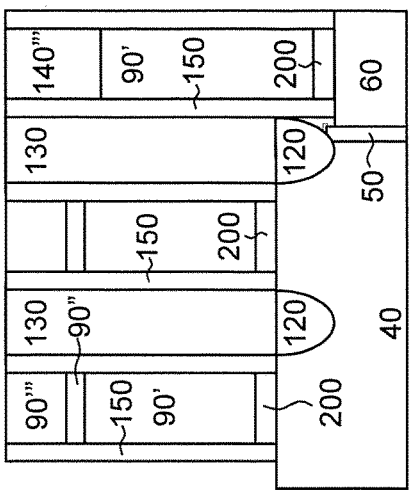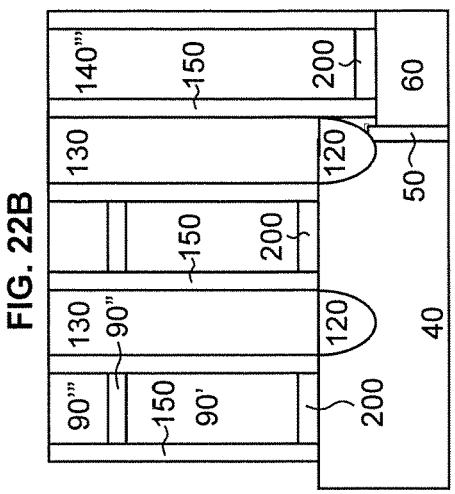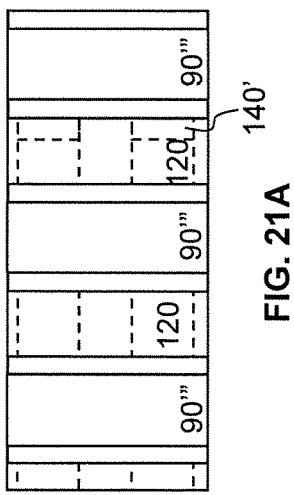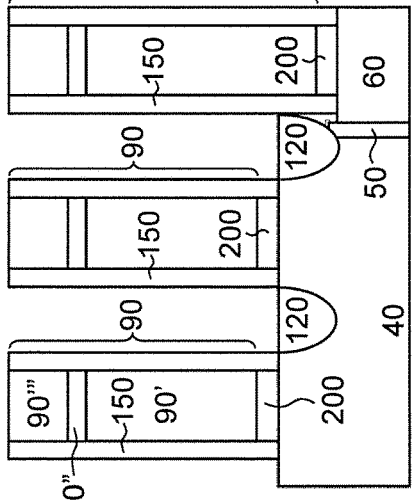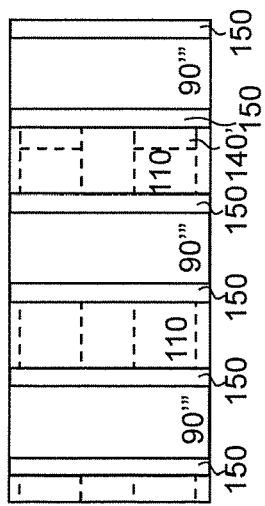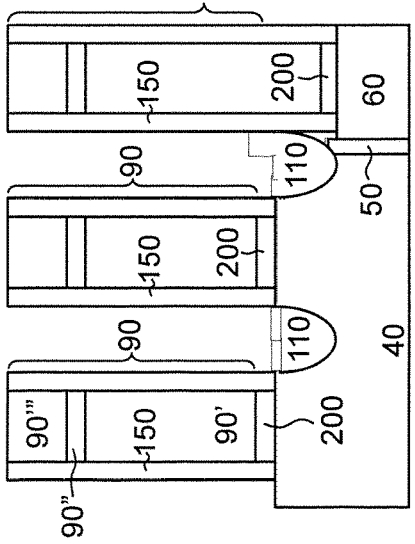

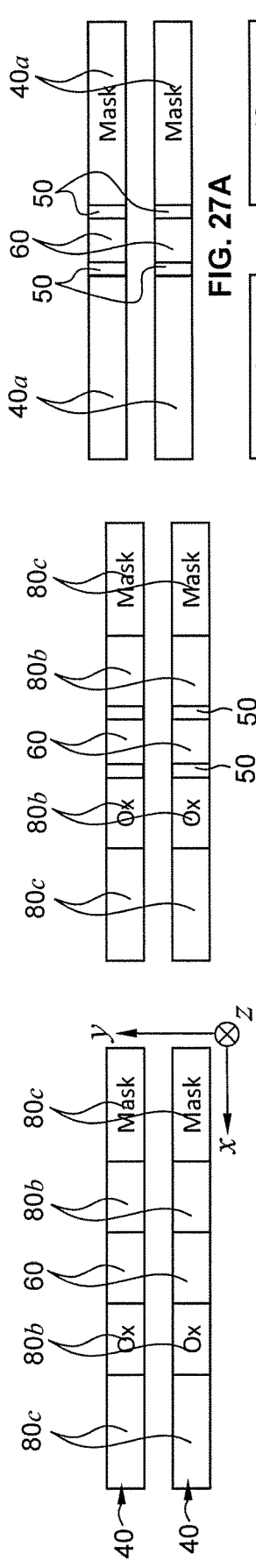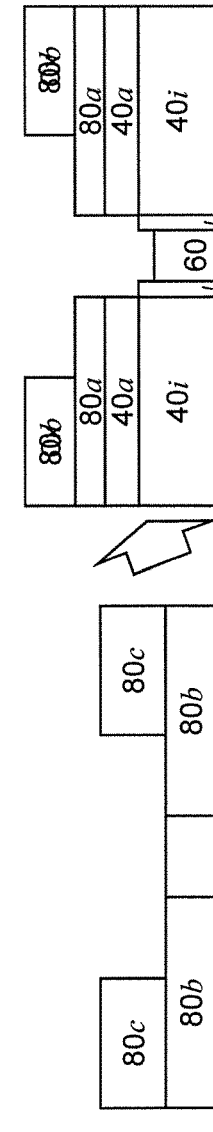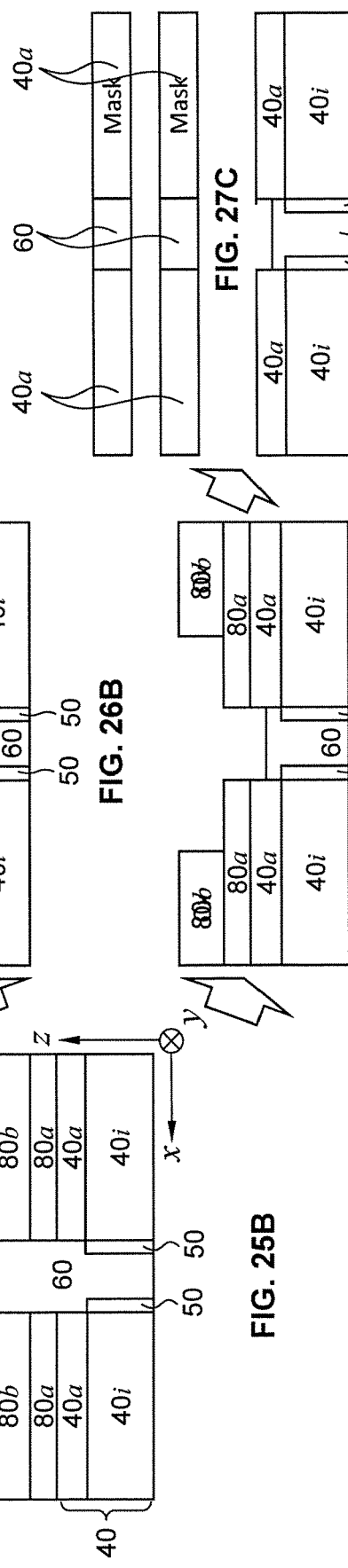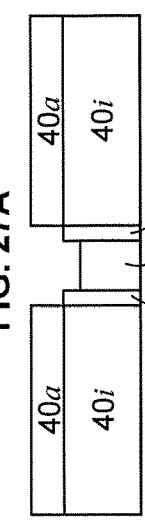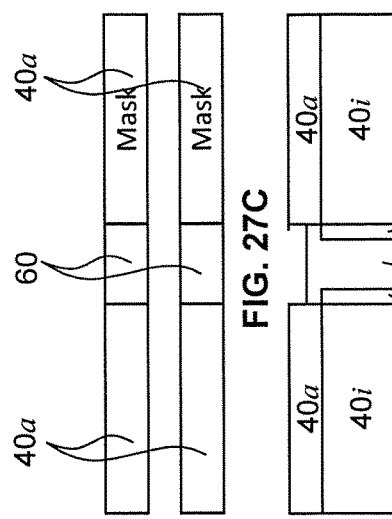

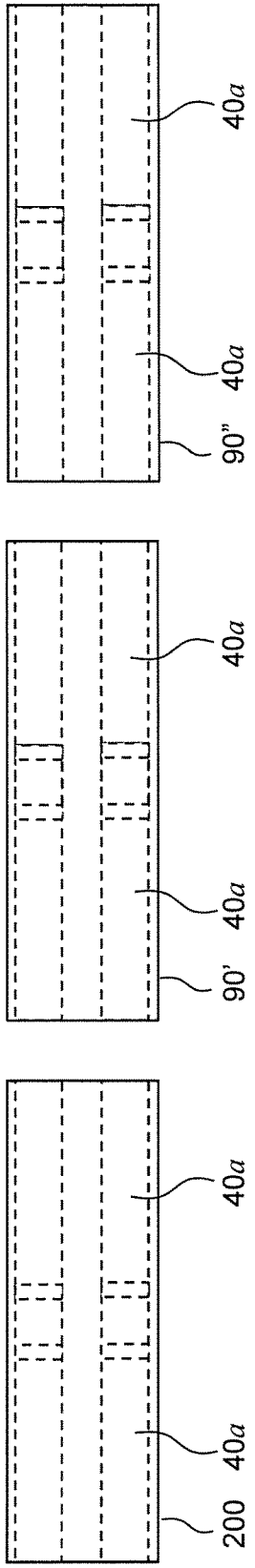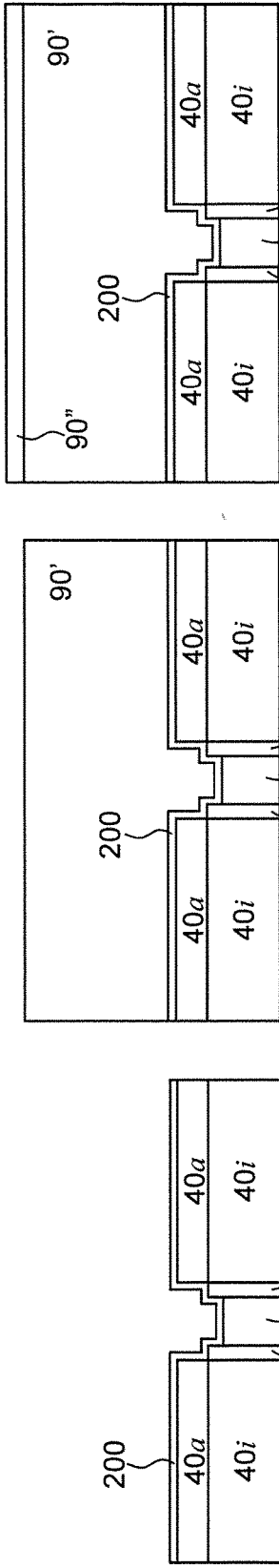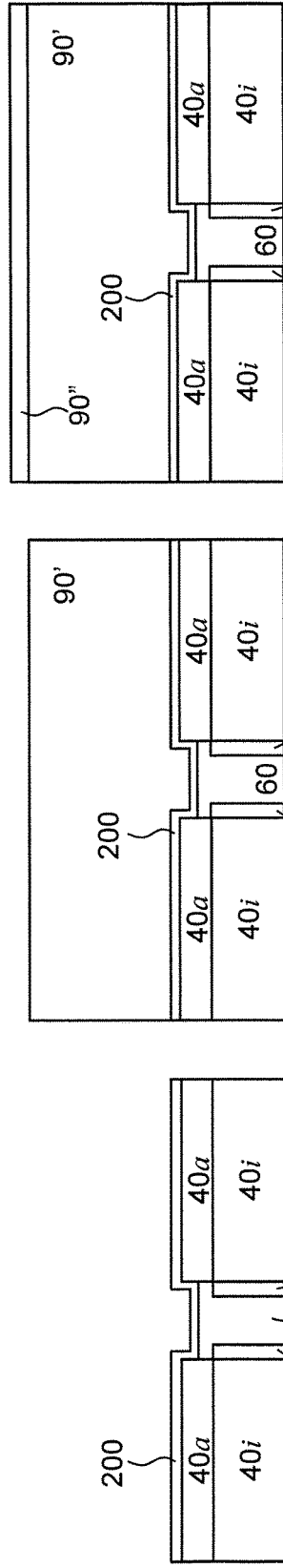

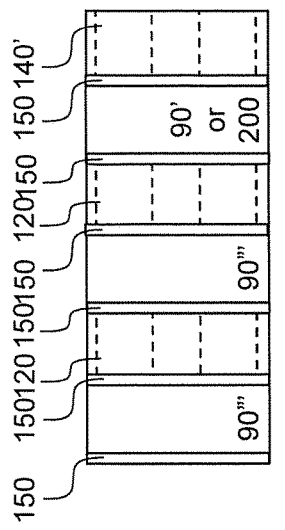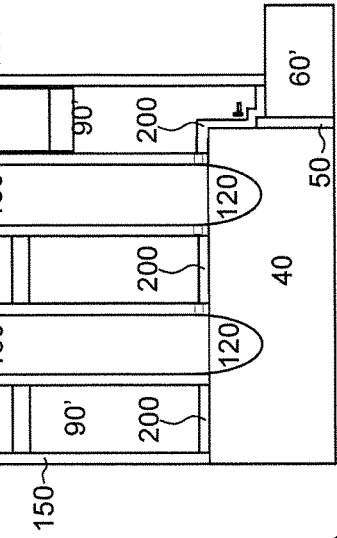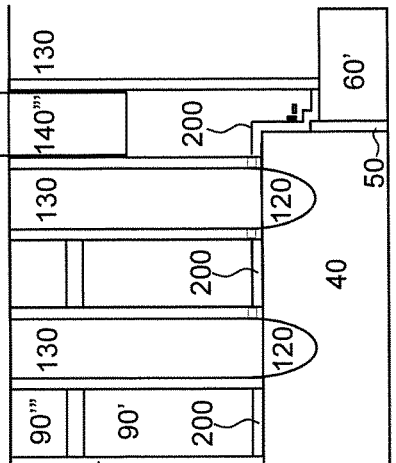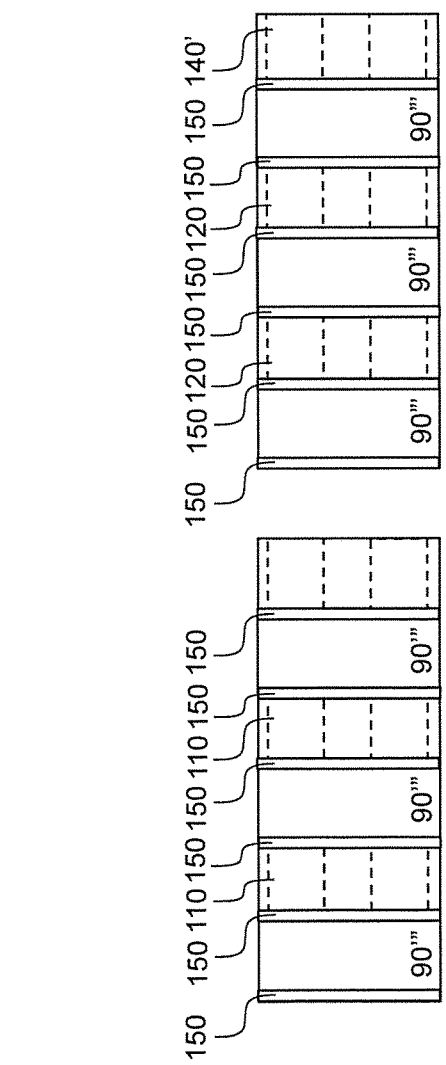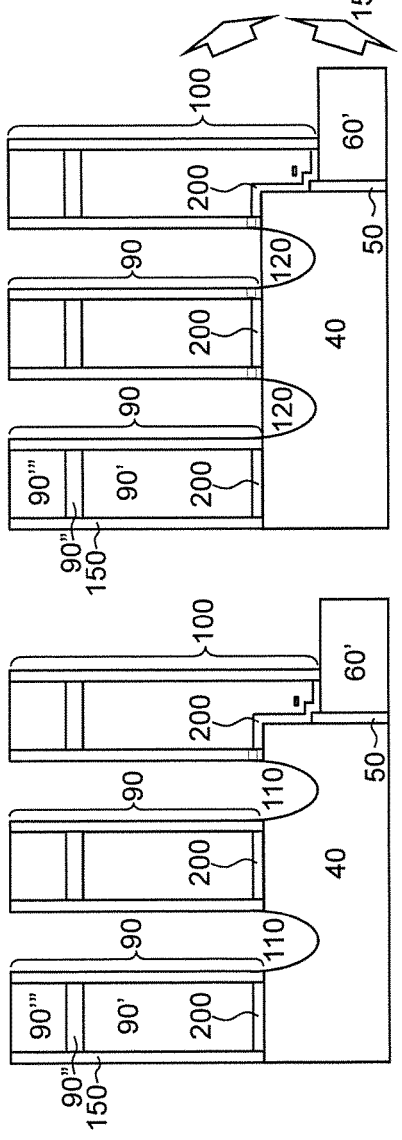

SEMICONDUCTOR DEVICE WITH FIN END SPACER DUMMY GATE AND METHOD OF MANUFACTURING THE SAME

TECHNICAL FIELD

The disclosure relates to methods of manufacturing fin field effect transistors (FinFETs) and/or gate-all-around (GAA) field effect transistors (FETs) for semiconductor integrated circuits, and more particularly to methods of manufacturing fin end spacer dummy gate to protect a source/drain epitaxial layer, and semiconductor devices.

BACKGROUND

Traditional planar thin film devices provide superior performance with low power consumption. To enhance the device controllability and reduce the substrate surface area occupied by the planar devices, the semiconductor industry has progressed into nanometer technology process nodes in pursuit of higher device density, higher performance, and lower costs. Challenges from both fabrication and design issues have resulted in the development of three-dimensional designs, such as a multi-gate field effect transistor (FET), including a fin field effect transistor (FinFET) and a gate-all-around (GAA) field effect transistor (FET). In a FinFET, a gate electrode is adjacent to three side surfaces of a channel region with a gate dielectric layer interposed therebetween. Because the gate structure surrounds (wraps) the fin on three surfaces (i.e., the top surface and the opposite lateral surfaces), the transistor essentially has three gates controlling (one gate at each of the top surface and the opposite lateral surfaces) the current through the fin or channel region. The fourth side of the bottom of the channel is far away from the gate electrode and thus is not under close gate control. In contrast, in a GAA FET, all side surfaces (i.e. the top surface, the opposite lateral surfaces, and the bottom surface) of the channel region are surrounded by the gate electrode, which allows for fuller depletion in the channel region and results in reduced short-channel effect due to steeper sub-threshold current swing (SS) and smaller drain induced barrier lowering (DIBL). As transistor dimensions are continually scaled down to sub 10-15 nm technology nodes, further improvements of the FinFETs and/or GAA FETs are required.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 9A, 9B, 10A, 10B, 10C, 11A, 11B, 11C, 11D, 12A, 12B, 12C, 13A, 13B, 13C, 14A, 14B, 14C, 15A, 15B, 16A, 16B, 17A, 17B, 18A, 18B, 19A, 19B, 20A, 20B, 21A, 21B, 22A, 22B, and 22C show operations of manufacturing a semiconductor FinFET device according to an embodiment of the present disclosure. Each of FIGS. 9A, 10A, 11A, 12A, 13A, 14A, 15A, 16A, 17A, 18A, 19A, 20A, 21A, and 22A includes a top plan view and each of FIGS. 9B, 9C, 10B, 10C, 11B, 11C, 12B, 12C, 13B, 13C, 14B, 14C, 15B, 16B, 17B, 18B, 19B, 20B, 21B, 22B, and 22C includes a cross-sectional view of the semiconductor FinFET device along a cut line A-A in a plane including x and z axes of FIG. 7.

FIGS. 25A, 25B, 26A, 26B, 26C, 27A, 27B, 27C, 27D, 28A, 28B, 28C, 29A, 29B, 29C, 30A, 30B, 30C, 31A, 31B, 32A, 32B, 33A, 33B, 34A, 34B, 35A, 35B, 36A, 36B, 37A, 37B, 38A, 38B, and 38C show operations of manufacturing a semiconductor FinFET device according to an embodiment of the present disclosure. Each of FIGS. 25A, 26A, 27A, 27C, 28A, 29A, 30A, 31A, 32A, 33A, 34A, 35A, 36A, 37A, and 38A includes a top plan view and each of FIGS. 25B, 26B, 26C, 27B, 27D, 28B, 28C, 29B, 29C, 30B, 30C, 31B, 32B, 33B, 34B, 35B, 36B, 37B, 38B, and 38C includes a cross-sectional view of the semiconductor FinFET device along a cut line A-A in a plane including x and z axes of FIG. 23.

DETAILED DESCRIPTION

Figure 2:
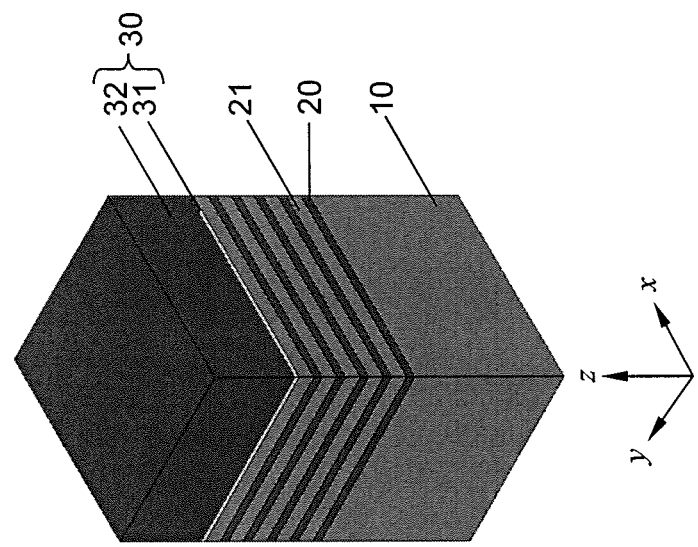
FIG. 2 shows a schematic view of stacked semiconductor layers formed over the processed substrate of FIG. 1, according to an embodiment of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "being made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described.

In this disclosure, a source/drain refers to a source and/or a drain. It is noted that in the present disclosure, a source and a drain are interchangeably used and the structures thereof are substantially the same.

During the manufacturing process of a semiconductor FET device having source/drain epitaxial layers, overlay shift may occur and cause misalignment of structures, e.g. dummy polycrystalline silicon structures formed on an edge of a fin end region for protection of the edge of the fin end region. The dummy polycrystalline silicon structure is called a 'dummy structure' because it will be subsequently removed and is not part of the circuitry. Overlay shift, however, may shift the position of the dummy polycrystalline silicon structure formed at the edge of a fin end region to a region away from the fin end, forming a narrow gap adjacent to the fine end. This narrow gap does not allow a complete formation of a protective layer, e.g. sidewall layer, and prevents the protective layer from carrying out its designed function (e.g. shielding the source/drain epitaxial layer from etchant). This may lead to defects such as a damaged source/drain epitaxial layer by etching with a loss of material of the source/drain epitaxial layer and/or a chemical alteration of the source/drain epitaxial layer. Such defects could cause the entire wafer to be defective and, therefore, discarded. When the gap is sufficiently wide due to overlay shift, the protective layer can still be formed completely and the overlay shift does not cause the defect formation.

Much effort has been applied to model overlay so as to solve the overlay shift problem. For example, the linear overlay model is designed for such purpose. Without negligible field to field and wafer to wafer overlay variations, the total overlay shift in a specific in-plane direction along a major surface of the wafer is equal to the sum of the translation overlay parameter, magnification overlay parameter, rotation overlay parameter, and a residual overlay parameter. Along with the downscaling of device dimension to nanoscale, the control of overlay shift is critical to the critical dimension (CD) variability. Embodiments of the present disclosure are described therein.

Figure 1:
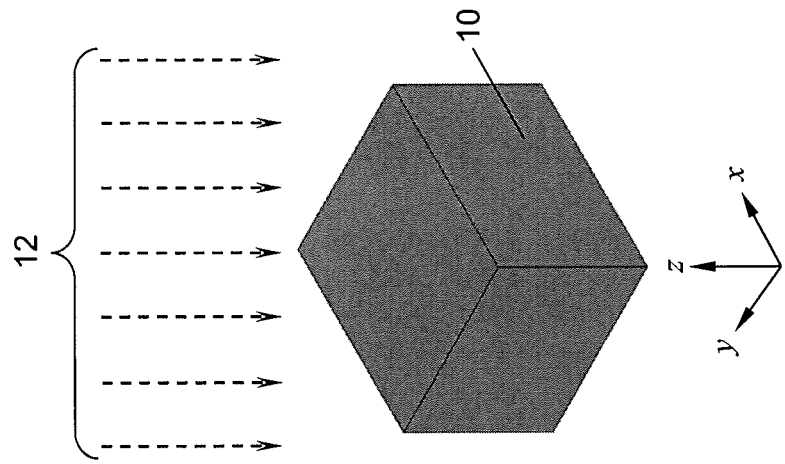
FIG. 1 shows a schematic view of a processing operation of a substrate, according to an embodiment of the present disclosure.

As shown in FIG. 1, impurity ions (dopants) 12 are implanted into a semiconductor substrate 10 to form a well region. The ion implantation is performed to prevent a punch-through effect. In one embodiment, substrate 10 includes a single crystalline semiconductor layer on at least it surface portion. The substrate 10 may comprise a single crystalline semiconductor material such as, but not limited to Si, Ge, SiGe, GaAs, InSb, GaP, GaSb, InAlAs, InGaAs, GaSbP, GaAsSb and InP. In this embodiment, the substrate 10 is made of Si. The substrate 10 may include in its surface region, one or more buffer layers (not shown). The buffer layers can serve to gradually change the lattice constant from that of the substrate to that of the source/drain regions. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP. In a particular embodiment, the substrate 10 comprises silicon germanium (SiGe) buffer layers epitaxially grown on the silicon substrate 10. The germanium concentration of the SiGe buffer layers may increase from 30 atomic % germanium for the bottom-most buffer layer to 70 atomic % germanium for the top-most buffer layer. In some embodiments of the present disclosure, the substrate 10 includes various regions that have been suitably doped with impurities (e.g., p-type or n-type conductivity). The dopants 12 are, for example, boron ($BF_2$) for an n-type FinFET and phosphorus for a p-type FinFET.

In FIG. 2, stacked semiconductor layers are formed over the substrate 10, in a case where a gate all-around (GAA) field effect transistor (FET) is fabricated. The stacked semiconductor layers include first semiconductor layers 20 and second semiconductor layers 21. The first semiconductor layers 20 and the second semiconductor layers 21 are formed of materials having different lattice constants, and include one or more layers of Si, Ge, SiGe, GaAs, InSb, GaP, GaSb, InAlAs, InGaAs, GaSbP, GaAsSb or InP, according to some embodiments of the present disclosure.

In some embodiments, the first semiconductor layers 20 and the second semiconductor layers 21 are formed of Si, a Si compound, SiGe, Ge or a Ge compound. In one embodiment, the first semiconductor layers 20 are $Si_{1-x}Ge_x$, where x is more than about 0.3, or Ge (x=1.0) and the second semiconductor layers 21 are Si or $Si_{1-y}Ge_y$, where y is less than about 0.4 and x>y. In this disclosure, an "M compound" or an "M based compound" means the majority of the compound is M.

In another embodiment, the second semiconductor layers 21 are $Si_{1-y}Ge_y$, where y is more than about 0.3, or Ge, and the first semiconductor layers 20 are Si or $Si_{1-x}Ge_x$, where x is less than about 0.4 and x<y. In yet other embodiments, the first semiconductor layer 20 is made of $Si_{1-x}Ge_x$, where x is in a range from about 0.3 to about 0.8, and the second semiconductor layer 25 is made of $Si_{1-x}Ge_x$, where x is in a range from about 0.1 to about 0.4.

Also, in FIG. 2, five layers of the first semiconductor layer 20 and six layers of the second semiconductor layer 21 are disposed. However, the number of the layers are not limited to five, and may be as small as 1 (each layer) and in some embodiments, 2-10 layers of each of the first and second semiconductor layers are formed. By adjusting the numbers of the stacked layers, a driving current of the GAA FET device can be adjusted.

The first semiconductor layers 20 and the second semiconductor layers 21 are epitaxially formed over the substrate 10. The thickness of the first semiconductor layers 20 may be equal to or greater than that of the second semiconductor layers 25, and is in a range from about 5 nm to about 50 nm in some embodiments, and is in a range from about 10 nm to about 30 nm in other embodiments. The thickness of the second semiconductor layers 21 is in a range from about 5 nm to about 30 nm in some embodiments, and is in a range from about 10 nm to about 20 nm in other embodiments. The thickness of each of the first semiconductor layers 20 may be the same, or may vary. In some embodiments, the bottom first semiconductor layer 20 (the closest layer 20 to the substrate 10) is thicker than the remaining first semiconductor layers 20. The thickness of the bottom first semiconductor layer 20 is in a range from about 10 nm to about 50 nm in some embodiments, or is in a range from about 20 nm to about 40 nm in other embodiments.

Further, in FIG. 2, a mask layer 30 is formed over the stacked layers 20 and 21. In some embodiments, the mask layer 30 includes a first mask layer 31 and a second mask layer 32. The first mask layer 31 is a pad oxide layer made of a silicon oxide, which can be formed by a thermal oxidation. The second mask layer 32 is made of a silicon nitride, which is formed by chemical vapor deposition (CVD), including low pressure CVD (LPCVD) and plasma enhanced CVD (PECVD), physical vapor deposition (PVD), atomic layer deposition (ALD), or other suitable process. The mask layer 30 is patterned into a mask pattern by using patterning operations including photo-lithography and etching. In some embodiments, the first mask layer 31 is made of silicon nitride and the second mask layer 32 is made of silicon oxide.

Figure 3A:
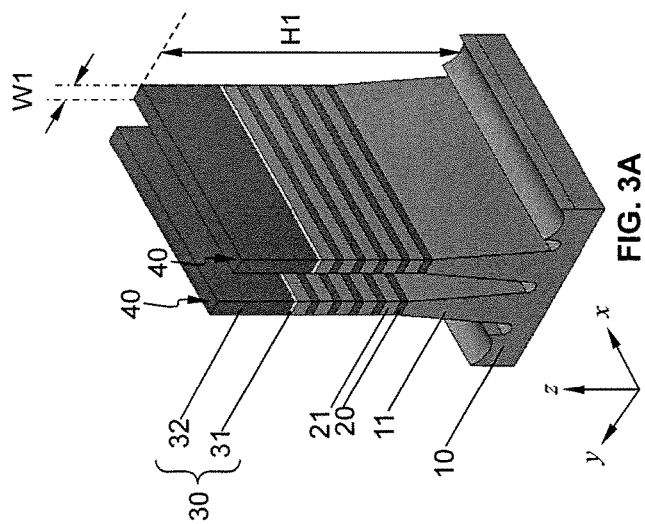
FIG. 3A shows a schematic view of fin structures made from the substrate and the stacked layers formed on the substrate of FIG. 2, according to an embodiment of the present disclosure.
Figure 3B:
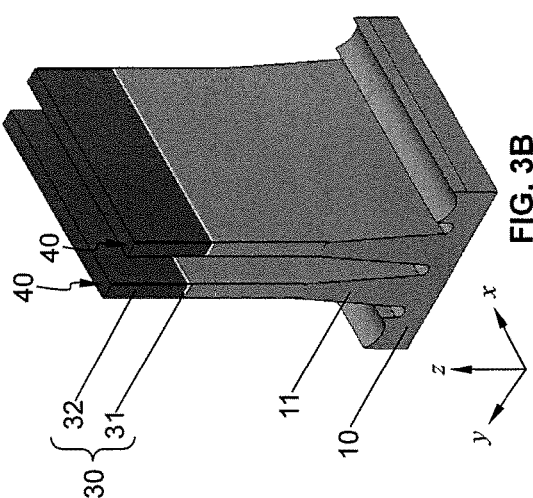
FIG. 3B shows a schematic view of fin structures, according to another embodiment of the present disclosure.
Figure 4A:
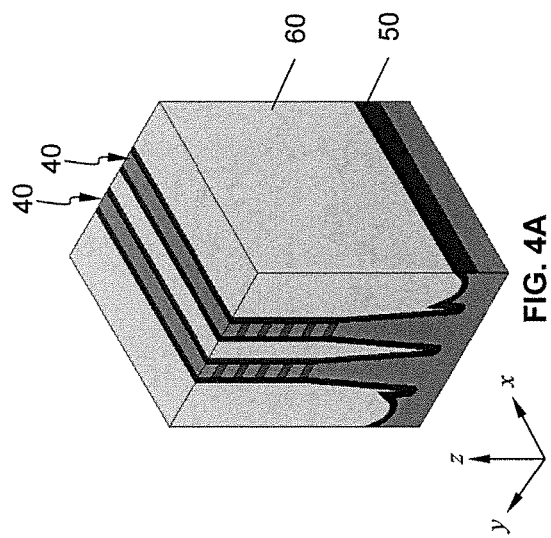
FIG. 4A shows a schematic view of the processed substrate of FIG. 3A, according to an embodiment of the present disclosure.
Figure 4B:
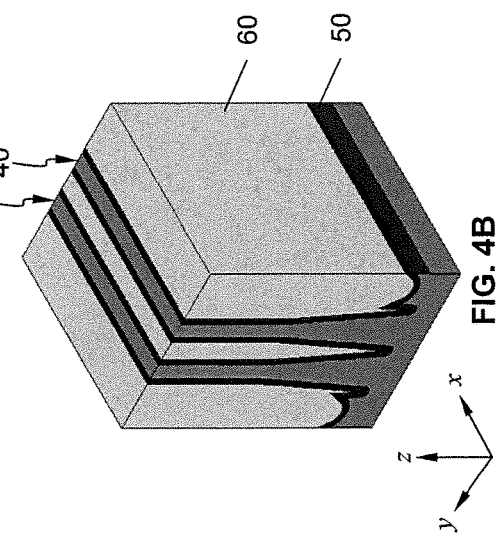
FIG. 4B shows a schematic view of the processed substrate of FIG. 3B, according to another embodiment of the present disclosure.

When the semiconductor device is a FinFET, no stacked layers are formed (see FIGS. 3B and 4B). In some embodiments, one or more epitaxial layers for a channel region are formed over the substrate 10. For GAA FET devices, operations shown in FIGS. 3A and 4A are applied. In FIG. 3A, the stacked layers of the first and second semiconductor layers 20, 21 are patterned by using the patterned mask layer 30, thereby the stacked layers 20 and 21 are formed into fin structures 40 extending in a lengthwise direction along the x direction. In some embodiments of the present disclosure, the fin structures 40 are formed by patterning using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. In some embodiments of the present disclosure, the photolithographic method includes ultraviolet (UV) photolithography, deep ultraviolet (DUV) photolithography, and extreme ultraviolet (EUV) photolithography.

In FIG. 3A, two fin structures 40 are arranged in the y direction but the number of the fin structures 40 is not limited to, and may be as small as one and three or more in some embodiments of the present disclosure. In some embodiments, one or more dummy fin structures are formed on both sides of the fin structures 40 to improve pattern fidelity in the patterning operations. As shown in FIG. 3A, the fin structures 40 have upper portions constituted by the stacked semiconductor layers 20, 21 and well portions 11. The width W1 of the upper portion of the fin structure 40 along the y direction is in a range from about 10 nm to about 40 nm in some embodiments, and is in a range from about 20 nm to about 30 nm in other embodiments. The height H1 along the z direction of the fin structure 40 is in a range from about 100 nm to about 200 nm.

FIG. 3B shows the case for a FinFET device. For a FinFET device, the substrate 10 (and/or an epitaxial layer formed over the substrate) is etched to form one or more fin structures. In FIG. 3B, the mask layer 30 including first mask layer 31 and second mask layer 32 formed on the substrate 10 is patterned by using the patterned mask layer 30, thereby the substrate 10 is formed into fin structures 40 extending in the lengthwise direction along the x direction. In FIG. 3B, two fin structures 40 are arranged in the y direction but the number of the fin structures 40 is not limited to two, and may be as small as one and three or more in some embodiments of the present disclosure, depending on the desired device performance and device architecture. In some embodiments, one or more dummy fin structures (not shown) are formed on both sides of the fin structures 40, i.e. between the two fin structures 40, to improve pattern fidelity in the patterning operations such as photolithographic patterning of the mask layer 30. As shown in FIG. 3B, the substrate 10 has well portions 11.

After the fin structures 40 are formed in FIG. 3A or FIG. 3B, an insulating material layer 60 including one or more layers of insulating material is formed over the substrate 10 in FIG. 4A or FIG. 4B so that the fin structures 40 are fully embedded in the insulating material layer 60. The insulating material for the insulating material layer 60 includes silicon oxide, silicon nitride, silicon oxynitride, silicon carbon nitride, silicon carbon oxynitride, fluorine-doped silicate glass (FSG), or a low-k dielectric material, formed by LPCVD (low pressure chemical vapor deposition), plasma-CVD or flowable CVD. An anneal operation is performed after the formation of the insulating layer 60 in some embodiments of the present disclosure. Then, a planarization operation, such as a chemical mechanical polishing (CMP) method and/or an etch-back method, is performed such that the upper surface of the uppermost second semiconductor layer 21 or fin structure 40 is exposed from the insulating material layer 60 as shown in FIGS. 4A and 4B. In some embodiments, the first and second mask layers 31 and 32 are removed by the CMP as shown in FIGS. 4A and 4B, and in other embodiments, the CMP operation stops on the second mask layer 32. In some embodiments, a first liner layer or fin liner 50 is formed over the structure of FIGS. 3A and 3B before forming the insulating material layer 60, as shown FIG. 4A or FIG. 4B. The fin liner or first liner layer 50 is formed of silicon nitride or a silicon nitride-based material (e.g., silicon oxynitride Si—O—N, silicon carbon nitride Si—C—N, or silicon carbon oxynitride Si—C—O—N).

Figure 5A:
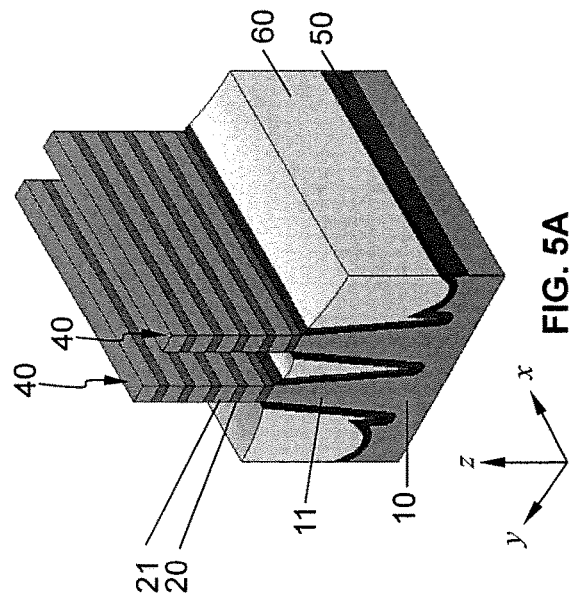
FIG. 5A shows a schematic view of the processed substrate of FIG. 4A, according to an embodiment of the present disclosure.
Figure 5B:
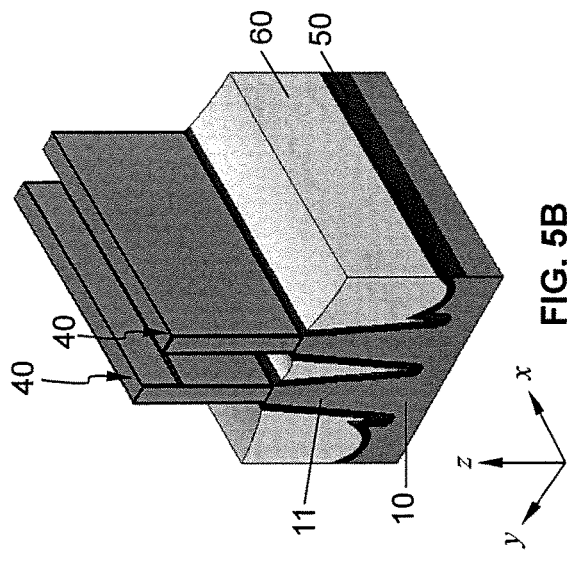
FIG. 5B shows a schematic view of the processed substrate of FIG. 4B, according to another embodiment of the present disclosure.

Then, as shown in FIG. 5A or FIG. 5B, the insulating material layer 60 is recessed to form an isolation insulating layer 60 so that the upper portions of the fin structures 40 are exposed. With this operation, the substrate 10 and the well portions 11 of the fin structures 40 are electrically separated from each other by the isolation insulating layer 60, which is also called a shallow trench isolation (STI) layer. In the embodiment shown in FIG. 5A, the insulating material layer 60 is recessed until the bottommost first semiconductor layer 20 is exposed. In other embodiments of the present disclosure, the upper portion of the well layer 11 is also partially exposed. The first semiconductor layers 20 are sacrificial layers which are subsequently partially removed, and the second semiconductor layers 21 are subsequently formed into channel layers of a GAA FET device.

Figure 6A:
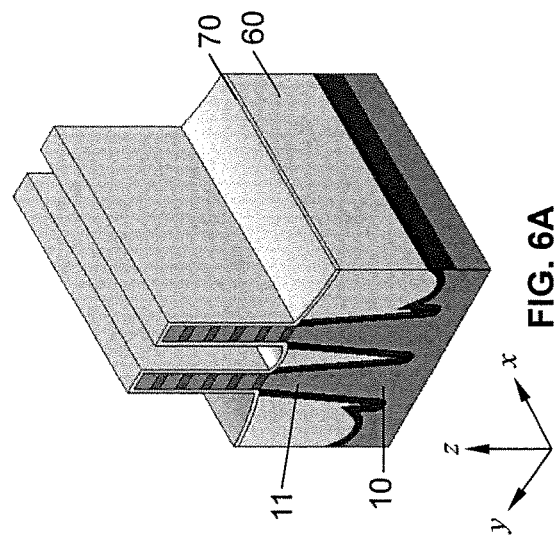
FIG. 6A shows a schematic view of the processed substrate of FIG. 5A, according to an embodiment of the present disclosure.
Figure 6B:
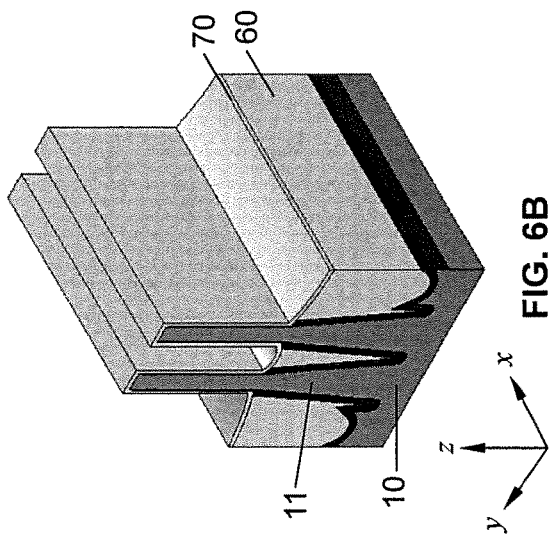
FIG. 6B shows a schematic view of the processed substrate of FIG. 5B, according to another embodiment of the present disclosure.

After the isolation insulating layer 60 is formed, a sacrificial gate dielectric layer 70 is formed, as shown in FIG. 6A or FIG. 6B. The sacrificial gate dielectric layer 70 includes one or more layers of insulating material, such as a silicon oxide-based material including $SiO_2$. In one embodiment, silicon oxide formed by chemical vapor deposition (CVD), including low pressure CVD (LPCVD) and plasma enhanced CVD (PECVD), physical vapor deposition (PVD), atomic layer deposition (ALD), or other suitable process is used. The thickness of the sacrificial gate dielectric layer 70 is in a range from about 1 nm to about 5 nm in some embodiments of the present disclosure. The sacrificial gate dielectric layer 70 is formed over the fin structure 40.

Figure 8:
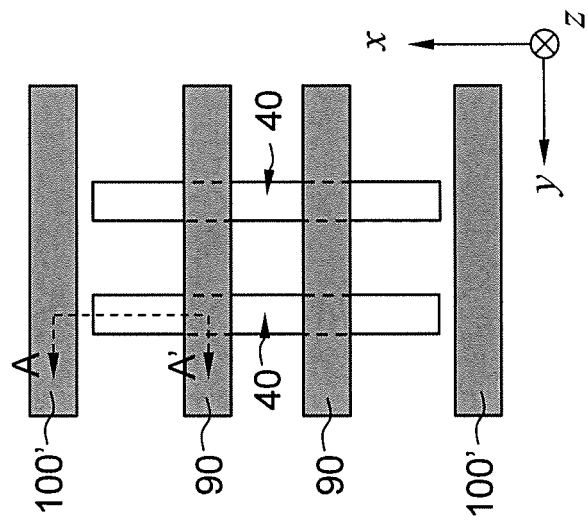
FIG. 8 shows a top plan view of the embodiment of FIG. 7.
Figure 7:
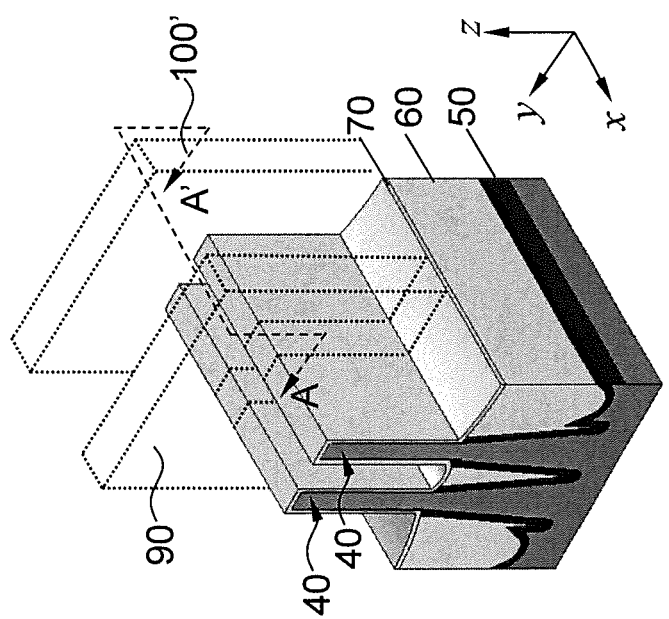
FIG. 7 shows a schematic view of an embodiment after processing the substrate of FIG. 6B.

Hereinafter, a manufacturing operation for a FinFET is explained. FIG. 7 shows a schematic view of the substrate of FIG. 6B with polycrystalline silicon dummy structures 90 and 100', according to an embodiment of the present disclosure and FIG. 8 shows a top plan view of the processed substrate of FIG. 7. In FIG. 7, in some embodiments of the present disclosure, the fin structures 40 are formed on the substrate 10 and extend in a lengthwise direction along x-direction. Each of the fin structures 40 has two fin edge regions at opposite ends along the lengthwise direction of the fin structures 40 along the x-direction. One or more channel regions are formed between the fin ends. In some embodiments of the present disclosure, the separation between the fin structures 40 depends on the device design, such as density of FinFET devices in a processor chip and the performance requirement of the semiconductor device having such a FinFET structure.

Also, in FIG. 7, the polycrystalline silicon dummy structures 100' are formed at a position adjacent to the fin ends of the fin structures 40 and are not formed over the fin structures 40. FIG. 8 shows a gap between the polycrystalline silicon dummy structure 100' and the fin structure 40. Also, polycrystalline silicon dummy structures 90 are formed over regions of the fin structures 40 between the fin edges or fin ends along the lengthwise direction in the x direction. The polycrystalline silicon dummy structures 90 are called 'dummy structures' and they will be removed and replaced with the gate structures of the FinFET devices, and the polycrystalline silicon dummy structures 100 are also 'dummy structures' because they will be subsequently removed. FIG. 8 shows a top plan view of the embodiment of FIG. 7. In FIG. 8, the polycrystalline silicon dummy structures 90 cover regions between the edges of fin ends of the fin structures 40 along a lengthwise direction of the fin structures 40. The polycrystalline silicon dummy structures 100' are not formed over the edges of ends of the fin structures 40. In some embodiments, the dummy structures 90 and 100' are formed of amorphous silicon or other suitable material.

FIGS. 9A, 9B, 10A, 10B, 11A, 11B, 12A, 12B, 13A, 13B, 14A, 14B, 15A, 15B, 16A, 16B, 17A, 17B, 18A, 18B, 19A, 19B, 20A, 20B, 21A, 21B, 22A, 22B, 23A, 23B, 24A, 24A, 25A, and 25B show operations of manufacturing a semiconductor FinFET device according to an embodiment of the present disclosure. Each of the FIGS. 9A, 10A, 11A, 12A, 13A, 14A, 15A, 16A, 17A, 18A, 19A, 20A, 21A, 22A, 23A, 24A, and 25A includes a top plan view and each of the FIGS. 9B, 10B, 11B, 12B, 13B, 14B, 15B, 16B, 17B, 18B, 19B, 20B, 21B, 22B, 23B, 24B, and 25B includes a cross-sectional view of the semiconductor FinFET device along a cut line A-A in a plane including x and z axes of FIG. 7. Throughout the various views and illustrative embodiments, like reference numbers are used to designate like elements. It is understood that additional operations can be provided before, during, and after processes shown by FIGS. 9A-24B, and some of the operations described below can be replaced or eliminated, for additional embodiments of the method. The order of the operations/processes may be interchangeable. Material, configuration, dimensions and/or processes the same as or similar to the foregoing embodiments described with respect to FIGS. 1-6B may be employed in the following embodiments, and detailed explanation thereof may be omitted.

FIGS. 9A and 9B show an operation for fin-end patterning. In particular, FIG. 9A shows a top plan view of an embodiment of the present disclosure. Also, FIG. 9B is a cross-sectional view of the embodiment, showing the layered structure. The fin structure 40 has a bottom region 40i and a top active region 40a which is processed to form a channel region (not shown) and a source/drain region (not shown). As set forth above, after the fin structures are patterned by using the first and second mask layers 31 and 32 as shown in FIG. 5A or 5B, the insulating material layer 60 is formed to cover the patterned fin structures. Then, a CMP operation is performed to remove the upper portion of the insulating material layer 60 to form a STI layer 60. In this embodiment, the CMP stops on the upper surface of the second mask layer 32. In FIG. 9B, a silicon nitride layer 80a, which corresponds to the first mask layer 31, is formed on the fin active region 40a and an insulating oxide layer 80b, which corresponds to the second mask layer 32, is formed on the silicon nitride layer 80a.

In FIG. 9B, a fin liner 50 is formed on the bottom region 40i of the fin structures 40. A mask pattern 80c is formed on the insulating oxide layer 80b by a photolithographic method. The mask pattern 80c is formed of a light sensitive photoresist material in some embodiments.

FIGS. 10A and 10B show an operation for etching the insulating oxide layer 80b and the shallow trench isolation (STI) layer 60. The etching includes one or more dry etching and/or wet etching. FIG. 10A shows a top plan view and FIG. 10B shows a cross-sectional view. FIG. 10B shows that the shallow trench isolation (STI) layer 60 is recessed and the fin liner 50 is not etched. In some embodiments of the present disclosure, the STI layer 60 is recessed to have a top surface lower than the top surface of the fin liner 50. In this way, a deep plug 140' (FIG. 12B) can be formed. In other embodiments of the present disclosure, the STI layer 60 is recessed to have a top surface at the same level as or higher than the top surface of the fin liner 50.

FIGS. 10A and 10C show an operation for etching the insulating oxide layer 80b and the shallow trench isolation (STI) layer 60. The etching includes one or more dry etching and/or wet etching. FIG. 10A shows a top plan view and FIG. 10C shows a cross-sectional view. FIG. 10C shows that the shallow trench isolation (STI) layer 60 is recessed and the fin liner 50 is not etched. In some embodiments of the present disclosure, the STI layer 60 is recessed to have a top surface higher than the top surface of the fin liner 50. In other embodiments of the present disclosure, the STI layer 60 is recessed to have a top surface at the same level as the top surface of the fin liner 50.

FIGS. 11A and 11B show an operation for chemical and mechanical polishing (CMP) process to remove the layers on the fin structure 40. FIG. 11A shows a top plan view and FIG. 11B shows a cross-sectional view of an operation of manufacturing a semiconductor device according to an embodiment of the disclosure. By the CMP process, the upper surfaces of the fin structures 40a are exposed. In this way, the insulating material layer 60 is formed with a top level lower than the fin liner 50.

FIGS. 11C and 11D show an operation for chemical and mechanical polishing (CMP) process to remove the layers on the fin structure 40. FIG. 11C shows a top plan view and FIG. 11D shows a cross-sectional view of an operation of manufacturing a semiconductor device according to an embodiment of the disclosure. By the CMP process, the upper surfaces of the fin structures 40a are exposed. In this way, the insulating material layer 60 is formed with a top level higher than the fin liner 50.

FIGS. 12A and 12B show that a dummy oxide layer 200, similar to the sacrificial gate dielectric layer 70, is formed on the fin structures 40. In some embodiments, the dummy oxide layer 200 is formed of insulating materials, such as silicon oxide by chemical vapor deposition (CVD), including low pressure CVD (LPCVD) and plasma enhanced CVD (PECVD); and physical vapor deposition (PVD), such as sputtering, or other suitable process.

FIGS. 12A and 12C show that a dummy oxide layer 200, similar to the sacrificial gate dielectric layer 70, is formed on the fin structures 40. In some embodiments, the dummy oxide layer 200 is formed of insulating materials, such as silicon oxide by chemical vapor deposition (CVD), including low pressure CVD (LPCVD) and plasma enhanced CVD (PECVD); and physical vapor deposition (PVD), such as sputtering, or other suitable process.

FIG. 13A shows a top plan view and FIGS. 13B and 13C show cross-sectional views of embodiments having a polycrystalline silicon layer 90' formed over the dummy oxide layer 200. In some embodiments, the polycrystalline silicon layer 90' is formed using chemical vapor deposition (CVD), including low pressure CVD (LPCVD) and plasma enhanced CVD (PECVD); and physical vapor deposition (PVD), such as sputtering; or other suitable process.

FIG. 14A shows a top plan view and FIGS. 14B and 14C show cross-sectional views of embodiments having one or more hard mask layers formed on the polycrystalline silicon layer 90'. In some embodiments, the hard mask layer includes a first hard mask layer 90" made of, for example, silicon nitride. The first hard mask layer 90" is formed by using chemical vapor deposition (CVD), including low pressure CVD (LPCVD) and plasma enhanced CVD (PECVD); and physical vapor deposition (PVD), such as sputtering, atomic layer deposition (ALD) or other suitable process.

FIGS. 15A-22B show cross-sectional views of processes of embodiments having the insulating material layer 60 with a top level lower than the fin liner 50 as an example. The processes of embodiments having the insulating material layer 60 with a top level higher than the fin liner 50 are not shown. One of ordinary skill in the art would readily understand, through the processes applied to embodiments having the insulating material layer 60 with a top level lower than the fin liner 50, the similar processes applied to embodiments having the insulating material layer 60 with a top level higher than the fin liner 50.

Figure 15A:
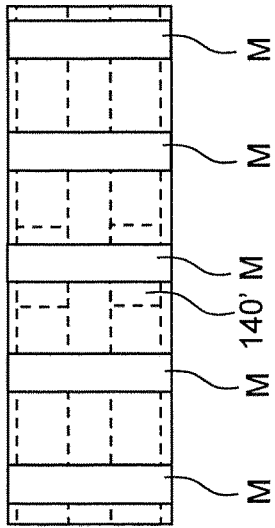
Figure 15B:
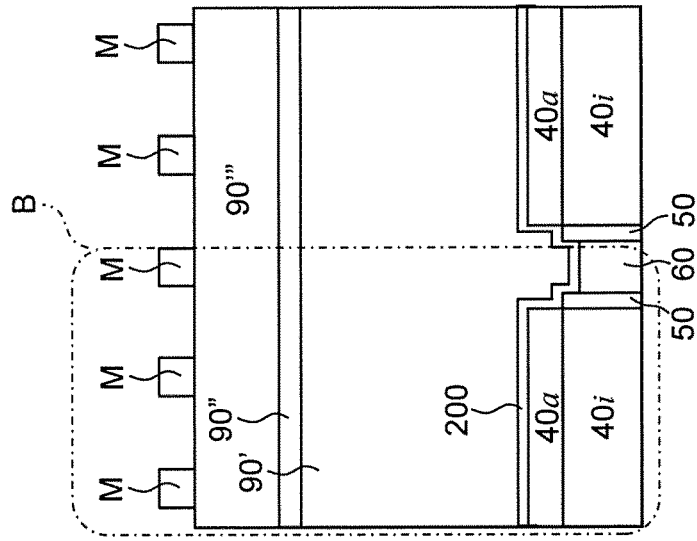

In FIGS. 15A and 15B, a second hard mask layer 90''' made of, for example, silicon oxide, is formed on the first hard mask layer 90". The second hard mask layer 90''' is formed by using chemical vapor deposition (CVD), including low pressure CVD (LPCVD) and plasma enhanced CVD (PECVD); and physical vapor deposition (PVD), such as sputtering; atomic layer deposition (ALD); or other suitable process. In some embodiments, the first hard mask layer 90" is made of silicon oxide based material, such as silicon oxide, and the second hard mask layer 90''' is made of silicon nitride based material as set forth above.

Figure 16A:
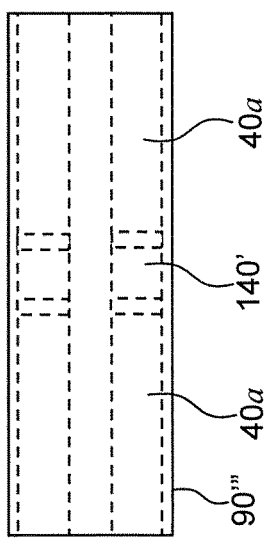
Figure 16B:
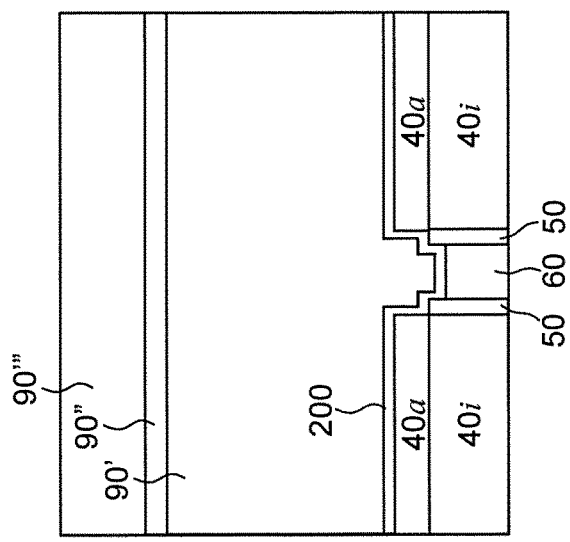

Then, as shown in FIGS. 16A and 16B, a mask pattern M is formed on the second hard mask layer 90''' by spin coating and photolithographic method. The mask pattern M is formed of a light-sensitive photoresist layer. The region B outlined by the dotted line will be discussed in further details in FIGS. 17A-22B. FIGS. 17A and 17B show the enlarged region B of the embodiment of FIG. 16B.

FIGS. 18A and 18B show an operation of etching the oxide hard mask layer 90''', silicon nitride hard mask layer 90", and the polycrystalline silicon layer 90' using the mask pattern M. The etching is anisotropic dry etching in some embodiments. Through this operation, the polycrystalline dummy silicon structures 90 and 100' are defined. The polycrystalline dummy silicon structure 90 is formed on a region in the fin structure 40, and the polycrystalline silicon dummy structure 100' is formed on a region spaced-apart from the fin end of the fin structure 40, e.g., between the ends of two adjacent fin structures. Since the plug 140' is made of a silicon nitride based material, which is the same as or similar to the material of the second hard mask layer 90''', the plug 140' is not substantially etched in the patterning operation of the silicon dummy structure 100'.

FIGS. 19A and 19B show an operation according to some embodiments of the present disclosure. In this operation, a gate sidewall spacer layer 150 is conformally formed on the patterned polycrystalline silicon dummy structures of FIGS. 18A and 18B. After the gate sidewall spacer layer 150 is formed, anisotropic etching is performed to remove the gate sidewall spacer layer 150 formed on the top of the polycrystalline silicon dummy structures 90 and 100' and on the upper surface of the fin structure 40 (as shown in FIGS. 19A and 19B). The conformally formed gate sidewall spacer layer 150 fully covers the polycrystalline dummy silicon structure 100' because the fin end spacer plug 140' fills a space adjacent to an end of the fin and a narrow gap is not formed. The gate sidewall spacer layer 150 protects the source/drain epitaxial layer from being etched. Since the gate sidewall spacer layer 150 is completely formed and the fin end spacer plug 140' fills the spacer between the fins, a subsequently formed source/drain epitaxial layer is fully protected from a subsequent etch process.

FIGS. 21A and 21B show an operation according to an embodiment of the present disclosure. In FIGS. 21A and 21B, source/drain epitaxial layer 120 is deposited in the source/drain space 110 formed in the fin active region 40a. In some embodiments, the source/drain epitaxial layer includes SiP, SiGe, etc. The source/drain epitaxial layer 120 is separated from the polycrystalline silicon dummy structures 90 and 100' by the fin end sidewall spacer plug 140' and/or the gate sidewall spacers 150 of the polycrystalline silicon dummy structures 100'.

FIGS. 22A, 22B, and 22C show an operation of depositing an interlayer dielectric (ILD) layer 130 on the source/drain epitaxial layer 120, and partially (FIG. 22B) or completely (FIG. 22C) removing the polycrystalline silicon dummy structure 100' without removing the sidewall spacers 150, in some embodiments of the present disclosure. In some embodiments of the present disclosure, a layer of spacer dummy gate 140''' is formed in the space formed by partially or completely removing polycrystalline silicon layer 100' in FIGS. 22B and 22C, respectively. In some embodiments, a contact etch stop layer (CESL) is formed over the structure of FIGS. 21A and 21B before the ILD layer 130 is formed. The spacer dummy gate 140''' serves to preserve the source/drain epitaxial layer 120 at fin end of the fin structure 40 during etching processes. In this way, the source/drain epitaxial layer 120 is not etched even if the gate sidewall spacer layer 150 which is supposed to protect the source/drain epitaxial layer 120 from etching is not fully formed.

Figure 24:
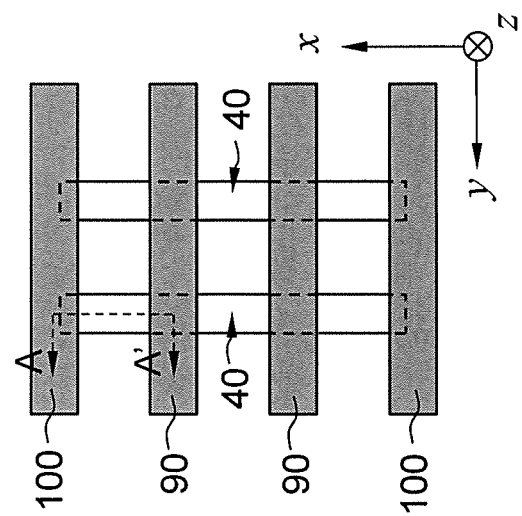
FIG. 24 shows a top plan view of the embodiment of FIG. 23.
Figure 23:
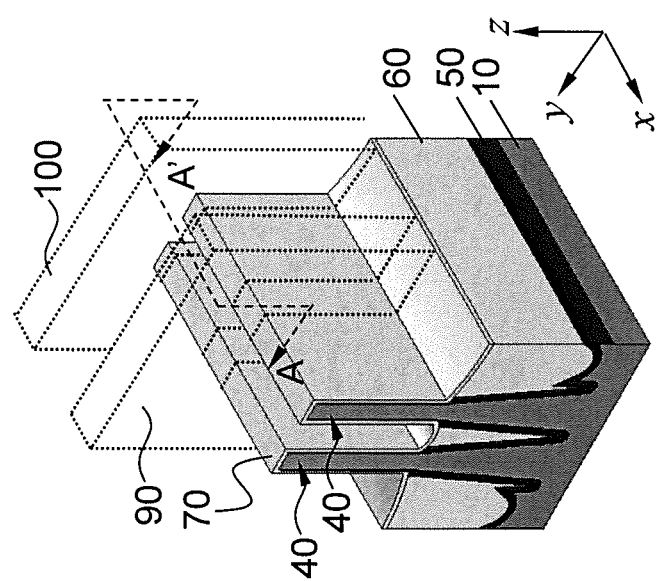
FIG. 23 shows a schematic view of another embodiment after processing the substrate of FIG. 6B.

Hereinafter, a manufacturing operation for a FinFET according to another embodiment is explained. FIG. 23 shows a schematic view of the substrate of FIG. 6B with polycrystalline silicon dummy structures 90 and 100, according to an embodiment of the present disclosure and FIG. 24 shows a top plan view of the processed substrate of FIG. 28. In FIG. 23, in some embodiments of the present disclosure, the fin structures 40 are formed on the substrate 10 and extend in a lengthwise direction along x-direction.

Each of the fin structures 40 has two fin edge regions at opposite ends along the lengthwise direction of the fin structures 40 in the x-direction. One or more channel regions are formed between the fin ends. In some embodiments of the present disclosure, the separation between the fin structures 40 depends on the device design.

Also, in FIG. 23, the polycrystalline silicon dummy structure 100 is formed over the fin ends of the fin structures 40. As shown in FIG. 24, there are no gaps between the polycrystalline silicon dummy structure 100 and the fin structure 40, and the polycrystalline silicon dummy structure 100 overlaps the ends of the fin structure 40. The polycrystalline silicon dummy structures 90 are formed over regions of the fin structures 40 between the fin ends along the lengthwise direction (i.e. x direction). FIG. 24 shows a top plan view of the embodiment of FIG. 23. In some embodiments, the dummy structures 90 and 100' are formed of amorphous silicon or other suitable material.

FIGS. 25A, 25B, 26A, 26B, 26C, 27A, 27B, 27C, 27D, 28A, 28B, 28C, 29A, 29B, 29C, 30A, 30B, 30C, 31A, 31B, 32A, 32B, 33A, 33B, 34A, 34B, 35A, 35B, 36A, 36B, 37A, 37B, 38A, and 38B show operations of manufacturing a semiconductor FinFET device according to an embodiment of the present disclosure. Each of FIGS. 25A, 26A, 27A, 27C, 28A, 29A, 30A, 31A, 32A, 33A, 34A, 35A, 36A, 37A, and 38A includes a top plan view and each of FIGS. 25B, 26B, 26C, 27B, 27D, 28B, 28C, 29B, 29C, 30B, 30C, 31B, 32B, 33B, 34B, 35B, 36B, 37B, and 38B includes a cross-sectional view of the semiconductor FinFET device along a cut line A-A in a plane including x and z axes of FIG. 1. Throughout the various views and illustrative embodiments, like reference numbers are used to designate like elements. It is understood that additional operations can be provided before, during, and after processes shown by FIGS. 25A-38B, and some of the operations described below can be replaced or eliminated, for additional embodiments of the method. The order of the operations/processes may be interchangeable. Material, configuration, dimensions and/or processes the same as or similar to the foregoing embodiments described with respect to FIGS. 1-22B may be employed in the following embodiments, and detailed explanation thereof may be omitted.

FIGS. 25A and 25B show an operation for fin-end patterning. In particular, FIG. 25A shows a top plan view of an embodiment of the present disclosure. Also, FIG. 25B shows a cross-sectional view of the embodiment, indicating the layering structure. The fin structure 40 has a bottom region 40i and a top active region 40a which is processed to form a channel region (not shown) and a source/drain region (not shown). As set forth above, after the fin structures 40 are patterned by using the first and second mask layers 31 and 32 as shown in FIG. 5A or 5B, the insulating material layer 60 is formed to cover the patterned fin structures 40. Then, a CMP operation is performed to remove the upper portion of the insulating material layer 60 to form an STI layer 60. In this embodiment, the CMP stops on the upper surface of the second mask layer 32. In FIGS. 25A and 25B, a silicon nitride layer 80a, which corresponds to the first mask layer 31, is formed on the fin active region 40a, and an insulating oxide layer 80b, which corresponds to the second mask layer 32, is formed on the silicon nitride layer 80a.

In FIG. 25B, a fin liner 50 is formed on the bottom region 40i of the fin structures 40. A mask pattern 80c is subsequently formed on the insulating oxide layer 80b by a photolithographic method. The mask pattern 80c is formed of a light sensitive photoresist material in some embodiments.

FIGS. 26A and 26B show an operation for etching the insulating oxide layer 80b and the shallow trench isolation (STI) layer 60. The etching includes one or more dry etching and/or wet etching. FIG. 26A shows a top plan view, and FIG. 26B shows a cross-sectional view of the embodiment. FIG. 26B shows that the shallow trench isolation (STI) layer 60 is recessed and the fin liner 50 is not etched. In some embodiments of the present disclosure, the STI layer 60 is recessed to have a top surface of a level lower than the top surface of the fin liner 50 (FIG. 26B). In some embodiments of the present disclosure, the STI layer 60 is recessed to have a top surface at the higher level than the top surface of the fin liner 50 (FIG. 26C).

FIGS. 26A and 26C show an operation for etching the insulating oxide layer 80b and the shallow trench isolation (STI) layer 60. The etching includes one or more dry etching and/or wet etching. FIG. 26A shows a top plan view, and FIG. 26C shows a cross-sectional view of the embodiment. FIG. 26B shows that the shallow trench isolation (STI) layer 60 is recessed and the fin liner 50 is not etched. In some embodiments of the present disclosure, the STI layer 60 is recessed to have a top surface at a level higher than the top surface of the fin liner 50 (FIG. 26C). In some embodiments of the present disclosure, the STI layer 60 is recessed to have a top surface at a lower level than the top surface of the fin liner 50 (FIG. 26B).

FIGS. 27A and 27B show an operation for chemical and mechanical polishing (CMP) process to remove the layers over the fin structure 40. By the CMP process, the upper surfaces of the fin structures 40 are exposed.

FIGS. 27C and 27D show an operation for chemical and mechanical polishing (CMP) process to remove the layers over the fin structure 40. By the CMP process, the upper surfaces of the fin structures 40 are exposed.

FIGS. 28A and 28B show that a dummy oxide layer 200, similar to the sacrificial gate dielectric layer 70, is formed on the fin structures 40. In some embodiments, the dummy oxide layer 200 is formed of insulating materials such as silicon oxide by chemical vapor deposition (CVD), including low pressure CVD (LPCVD) and plasma enhanced CVD (PECVD); and physical vapor deposition (PVD) such as sputtering; or other suitable process.

FIGS. 28A and 28B show that a dummy oxide layer 200, similar to the sacrificial gate dielectric layer 70, is formed on the fin structures 40. In some embodiments, the dummy oxide layer 200 is formed of insulating materials such as silicon oxide by chemical vapor deposition (CVD), including low pressure CVD (LPCVD) and plasma enhanced CVD (PECVD); and physical vapor deposition (PVD) such as sputtering; or other suitable process.

In FIGS. 29A, 29B, and 29C, a polycrystalline silicon layer 90' is formed over the dummy oxide layer 200. In some embodiments, the polycrystalline silicon layer 90' is formed using chemical vapor deposition (CVD), including low pressure CVD (LPCVD) and plasma enhanced CVD (PECVD); and physical vapor deposition (PVD) such as sputtering; or other suitable process.

One or more hard mask layers are formed on the polycrystalline silicon layer 90' as shown in FIGS. 30A, 30B, and 30C. In some embodiments, the hard mask layer includes a first hard mask layer 90" made of, for example, silicon nitride. The hard mask layer 90" is formed by using chemical vapor deposition (CVD), including low pressure CVD (LPCVD) and plasma enhanced CVD (PECVD); and physical vapor deposition (PVD) such as sputtering; atomic layer deposition (ALD) or other suitable process.

FIGS. 31A-38B show cross-sectional views of processes of embodiments having the STI layer 60 recessed to have a top surface at a lower level than the top surface of the fin liner 50 as an example. The processes of embodiments having the STI layer 60 recessed to have a top surface at a higher level than the top surface of the fin liner 50 are not shown. One of ordinary skill in the art would readily understand, through the processes applied to embodiments having STI layer 60 recessed to have a top surface at a lower level than the top surface of the fin liner 50, the similar processes applied to embodiments having the shallow plug 140".

Figure 32A:
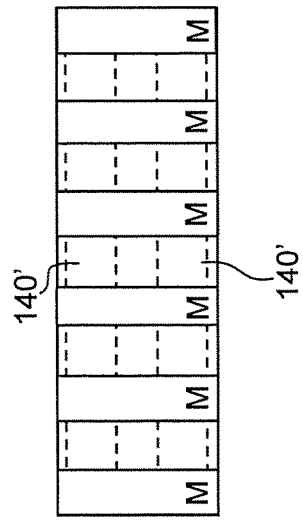
Figure 32B:
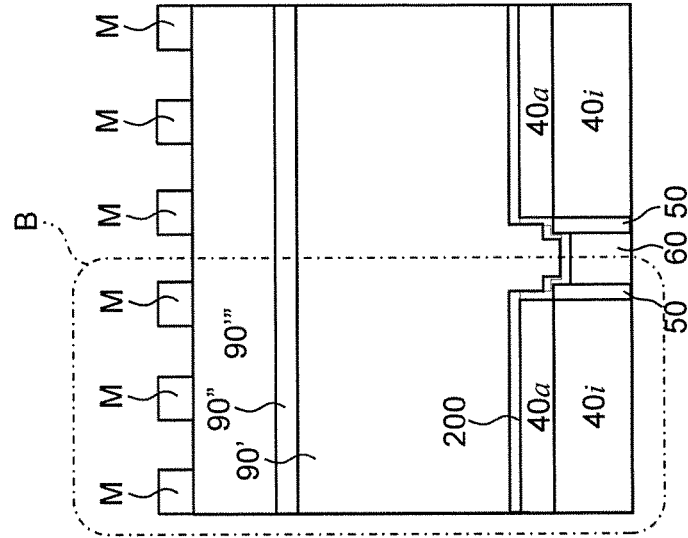
Figure 31A:
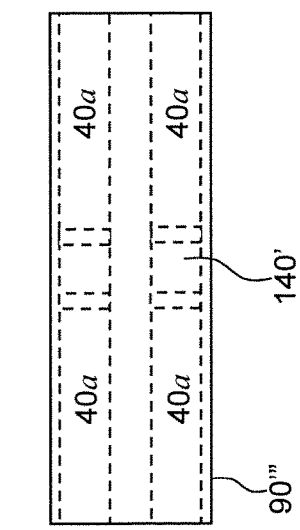
Figure 31B:
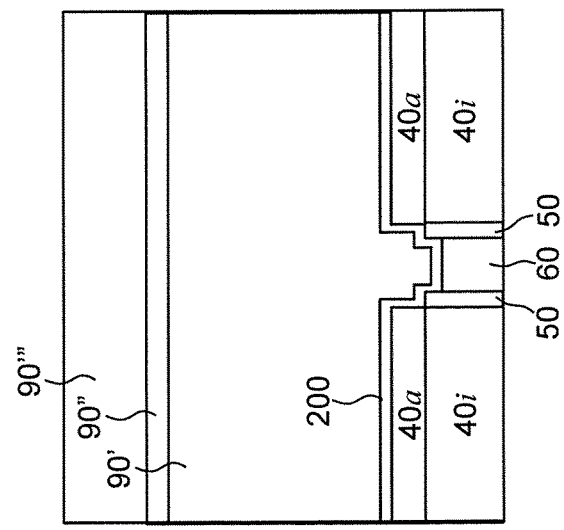
Figure 33A:
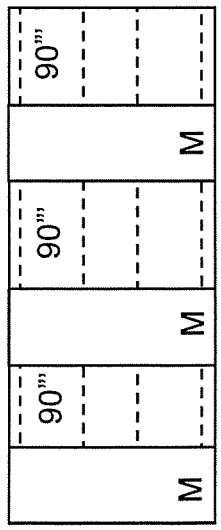
Figure 33B:
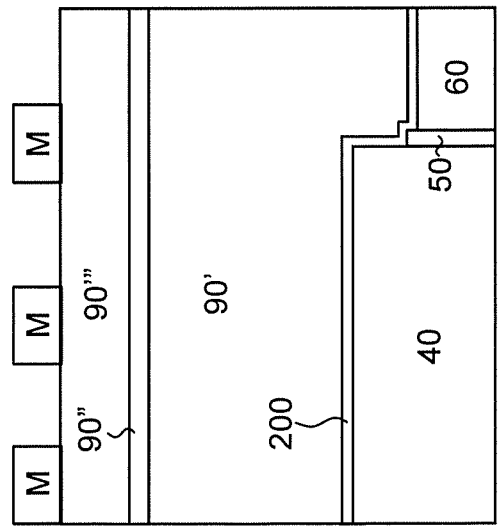

In FIGS. 31A and 31B, a second hard mask layer 90''' made of, for example, silicon oxide, is formed on the first hard mask layer 90". The second hard mask layer 90''' is formed by using chemical vapor deposition (CVD), including low pressure CVD (LPCVD) and plasma enhanced CVD (PECVD), and physical vapor deposition (PVD) such as sputtering, atomic layer deposition (ALD) or other suitable process. Then, as shown in FIGS. 32A and 32B, a mask pattern M is formed on the second hard mask layer 90''' by spin coating and a photolithographic method. The mask pattern M is formed of a light-sensitive photoresist layer in some embodiments. The region B outlined by the dotted line will be discussed in further details in FIGS. 33A-33B. FIGS. 33A and 33B show the enlarged region B of the embodiment of FIG. 32B.

Figure 34A:
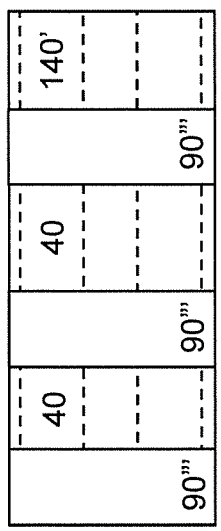
Figure 34B:
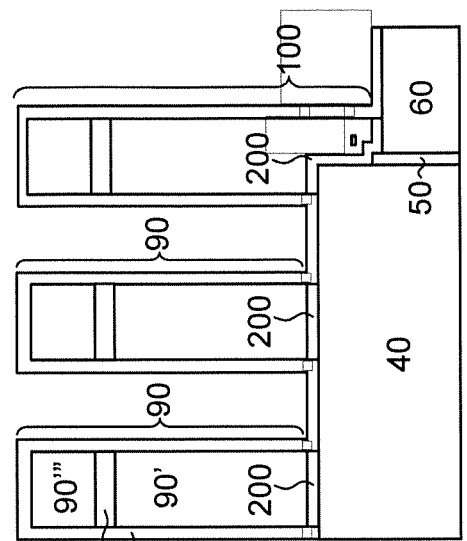

FIGS. 34A and 34B show an operation of etching the oxide hard mask layer 90''', silicon nitride hard mask layer 90", and the polycrystalline silicon layer 90' using the mask pattern M. The etching is anisotropic dry etching in some embodiments. Through this operation, the polycrystalline dummy silicon structures 90 and 100 are defined. The polycrystalline silicon dummy structures 90 are formed on a region in the fin structure 40, and the polycrystalline silicon dummy structures 100 are formed on an edge of the fin end of the fin structure 40.

Figure 35A:
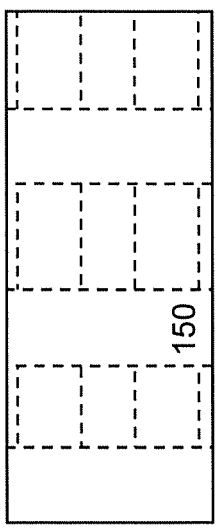
Figure 35B:
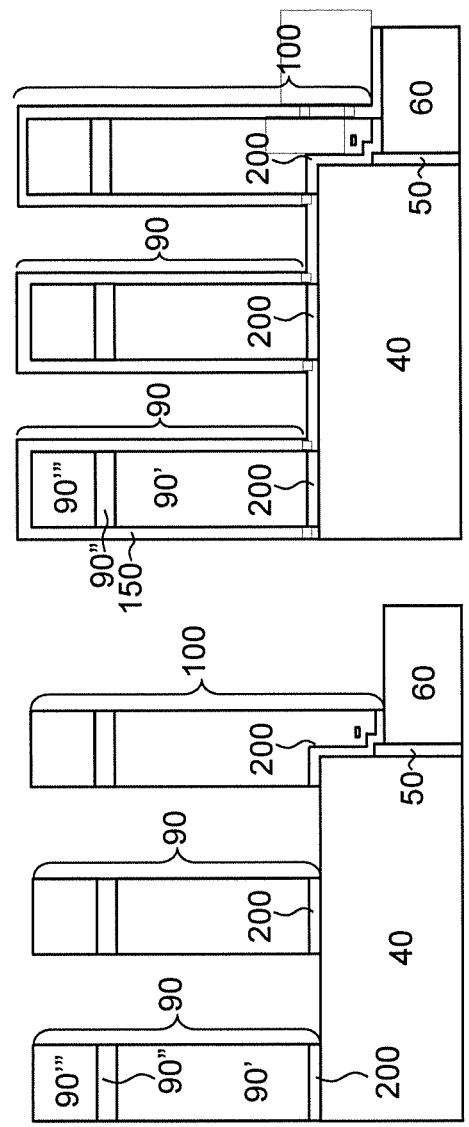

FIGS. 35A and 35B show an operation according to some embodiments of the present disclosure. In this operation, a gate sidewall spacer layer 150 is conformally formed on the patterned polycrystalline silicon dummy structures 90 and 100 of FIGS. 35A and 35B. After the gate sidewall spacer layer 150 is formed, anisotropic etching is performed to remove the gate sidewall spacer layer 150 formed on the top of the polycrystalline silicon dummy structures 90 and 100 and on the upper surface of the fin structure 40.

FIGS. 36A and 36B show an operation according to an embodiment of the present disclosure. In FIGS. 36A and 36B, a source/drain space 110 is formed in the fin active region 40a by etching of the fin active region 40a, at the region between the polycrystalline silicon dummy structures 90 and the polycrystalline silicon dummy structures 100.

FIGS. 37A and 37B show an operation according to an embodiment of the present disclosure. In FIGS. 37A and 37B, a source/drain epitaxial layer 120 including Si—P is deposited in the source/drain space 110 formed in the fin active region 40a. The source/drain epitaxial layer 120 is separated from the polycrystalline silicon dummy structures 90 and 100 by the sidewall spacer plug 140'.

FIGS. 38A and 38B show an operation of depositing an insulating dielectric layer 130 on the source/drain epitaxial layer 120 and partially (FIG. 38B) or completely (FIG. 38C) removing the polycrystalline silicon dummy structures 100' without removing the sidewall spacers 150. The spacer dummy gate 140''' is formed in the space formed by partially or completely removing the polycrystalline silicon dummy structures 100'. The spacer dummy gate 140''' serves to preserve the source/drain epitaxial layer 120 at the end of the fin structure 40.

In the above embodiments, the positions of the polycrystalline silicon dummy structures 100 (FIGS. 23-38C) and 100' (FIGS. 7-22C) are different. Because of the structure of the sidewall spacer 150 and the spacer dummy gate 140''' covering the polycrystalline silicon dummy structures 100 and 100' and the fin 40, the source/drain epitaxial layers 120 can still be maintained intact without being etched or chemically altered through subsequent semiconductor processing.

Overlay shift causes misalignment of structures and the formation of an undesirable narrow gap, which does not allow the protective layers of a device to be fully formed, thereby, causing defects in device. In the foregoing embodiments, a spacer dummy gate 140''' is employed to protect the source/drain epitaxial layer and fin ends during dummy polycrystalline silicon removal.

The various embodiments or examples described herein offer several advantages over the existing art. For example, in the present disclosure, the spacer dummy gate 140''' serves to preserve the source/drain epitaxial layer 120 at fin end of the fin structure 80 even when overlay shift occurs and the spacer layers 150 is not completely formed due to the narrowness of a gap adjacent to a fin end.

It will be understood that not all advantages have been necessarily discussed herein, no particular advantage is required for all embodiments or examples, and other embodiments or examples may offer different advantages. In accordance with an aspect of the present disclosure, in a method of manufacturing a semiconductor device, a first isolation insulating layer is formed between fins. A dummy oxide layer is formed over the fins and the first isolation insulating layer. Polycrystalline silicon layers are formed on the fins and on edge regions of the fins at an end in a lengthwise direction of the fins. Sidewall spacer layers are formed on the polycrystalline silicon layers. Source/drain regions of the fins are etched. The source/drain regions are not covered by the sidewall spacer layers, thereby forming source/drain spaces. Source/drain epitaxial layers are formed in the source/drain spaces. Interlayer dielectric layers are formed on the source/drain epitaxial layers. The polycrystalline silicon layers are etched. Spacer dummy gate layers are formed on the polycrystalline silicon layers.

In accordance with an aspect of the present disclosure, in a method of manufacturing a semiconductor device, an insulating layer is formed on a surface of an end of a fin along a lengthwise direction of the fin. A dummy oxide layer is formed on the insulating layer and the fin. Polycrystalline silicon layers are formed on the fin and on a region spaced-apart from the fin. A sidewall spacer layer is formed on the polycrystalline silicon layers. A source/drain region of the fin is etched. The source/drain region is not covered by the sidewall spacer layers, thereby forming a source/drain space. A source/drain epitaxial layer is formed in the source/drain space. The etched polycrystalline silicon layer is formed on the region spaced-apart from the fin. A spacer dummy gate layer is formed on the polycrystalline silicon layer formed on the region spaced-apart from the fin.

In accordance with another aspect of the present disclosure, a semiconductor device includes a plurality of fins on a substrate. A fin liner on an end surface of each of the plurality of fins. An insulating layer on the plurality of fins. Polycrystalline silicon layers on the insulating layer. A source/drain epitaxial layer in a source/drain space in each of the plurality of fins. One of the polycrystalline silicon layers is formed on a region spaced-apart from the fins. A spacer dummy gate is formed on the polycrystalline silicon layer.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:
   forming a first isolation insulating layer between fins;
   forming a sacrificial oxide layer over the fins and the first isolation insulating layer;
   forming first sacrificial gate layers on the fins and second sacrificial gate layers on edge regions of the fins at an end in a lengthwise direction of the fins;
   forming sidewall spacer layers on opposing side faces of the first and second sacrificial gate layers;
   etching source/drain regions of the fins, which are not covered by the sidewall spacer layers and the first and second sacrificial gate layers, thereby forming source/drain spaces;
   forming source/drain epitaxial layers in the source/drain spaces;
   forming interlayer dielectric layers on the source/drain epitaxial layers;
   at least partially removing the second sacrificial gate layers, thereby forming second gate spaces; and
   forming spacer dummy gate layers in the second gate spaces,
      wherein the second sacrificial gate layers are only partially removed leaving remaining second sacrificial layers and the spacer dummy gate layers are formed on the remaining second sacrificial layers.

2. The method of claim 1, wherein a thickness of the spacer dummy gate layers is smaller than a thickness of the remaining second sacrificial gate layers.

3. The method of claim 1, wherein the first and second sacrificial gate layers are made of polycrystalline silicon.

4. A method of manufacturing a semiconductor device, comprising:
   forming a fin protruding an isolation insulating layer, wherein a liner layer is disposed on a bottom of the fin;
   forming a sacrificial gate dielectric layer over the fin and the isolation insulating layer;
   forming a first sacrificial gate layer over an edge of the fin;
   forming sidewall spacer layers on opposing side face of the first sacrificial gate layer;
   etching a region of the fin adjacent to the first sacrificial gate layer, which is not covered by the sidewall spacer layers and the first sacrificial gate layer, thereby forming a source/drain space;
   forming a source/drain epitaxial layer in the source/drain space;
   forming an interlayer dielectric layer over the source/drain epitaxial layers;
   at least partially removing the first sacrificial gate layer, thereby forming a first gate spaces; and
   forming a spacer dummy gate layer in the first gate spaces,
      wherein the first sacrificial gate layer is only partially removed leaving a remaining first sacrificial layer, and the spacer dummy gate layer is formed on the remaining first sacrificial layers.

5. The method of claim 4, wherein a top of the liner layer is below a top of the isolation insulating layer.

6. The method of claim 4, wherein a top of the liner layer is above a top of the isolation insulating layer.

7. The method of claim 4, wherein a thickness of the spacer dummy gate layer is smaller than a thickness of the remaining first sacrificial gate layer.

8. The method of claim 4, wherein a bottom of the remaining first sacrificial layer has a step having an upper portion located above the fin and a lower portion located above the isolation insulating layer.

9. The method of claim 4, wherein the sacrificial gate dielectric layer under the bottom of the remaining first sacrificial layer is in contact with the fin, the liner and the isolation insulating layer.

10. The method of claim 1, wherein the sacrificial gate dielectric layer under the bottom of the spacer dummy gate layer is in contact with the fin, the liner and the isolation insulating layer.

11. The method of claim 1, wherein at the first and second sacrificial gate layers are made of polycrystalline silicon.

12. A method of manufacturing a semiconductor device, comprising:
   forming first fin and second fin, the first and second fins being aligned along a lengthwise direction of the first and second fins, wherein a liner layer is disposed on side faces of the first and second fins;
   forming a dummy oxide layer on an isolation insulating layer and the first and second fins;
   forming a first dummy gate layer over the first fin and a second dummy gate layer;
   forming sidewall spacer layers on the first and second dummy gate layers;
   etching source/drain regions of the first fin, which are not covered by the sidewall spacer layers, thereby forming source/drain spaces;
   forming source/drain epitaxial layers in the source/drain spaces;
   forming an interlayer dielectric layer over the source/drain epitaxial layers and the first and second dummy gate layers; and
   forming a spacer dummy gate layer over a recessed second dummy gate layer,
   wherein one layer of the source/drain epitaxial layers is adjacent to the first dummy gate layer and the spacer dummy gate layer, wherein one of the sidewall spacers is disposed between the one layer of the source/drain epitaxial layers and the first dummy gate layer and another sidewall spacer of the sidewall spaces is disposed between the one layer of the source/drain epitaxial layers and the spacer dummy gate layer.

13. The method of claim 12, wherein the spacer dummy gate is disposed over an edge of the first fin.

14. The method of claim 13, wherein the dummy oxide layer covers the edge of the first fin under the spacer dummy gate layer.

15. The method of claim 12, wherein the spacer dummy gate is disposed over a region between the first and second fins.

* * * * *